United States Patent
Lee et al.

(10) Patent No.: US 11,348,634 B2
(45) Date of Patent: May 31, 2022

(54) SEMICONDUCTOR MEMORY DEVICE WITH A SWITCHING MEMORY CELL IN A MEMORY STRING AND OPERATING METHOD THEREOF

(71) Applicant: SK hynix Inc., Icheon-si (KR)

(72) Inventors: Byung In Lee, Icheon-si (KR); Eun Hong Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/003,541

(22) Filed: Aug. 26, 2020

(65) Prior Publication Data
US 2021/0304810 A1    Sep. 30, 2021

(30) Foreign Application Priority Data
Mar. 24, 2020  (KR) .................. 10-2020-0035500

(51) Int. Cl.
| | |
|---|---|
| G11C 11/408 | (2006.01) |
| G11C 11/4094 | (2006.01) |
| G11C 5/06 | (2006.01) |
| G11C 11/4074 | (2006.01) |
| G11C 11/4097 | (2006.01) |

(52) U.S. Cl.
CPC ............ *G11C 11/4085* (2013.01); *G11C 5/06* (2013.01); *G11C 11/4074* (2013.01); *G11C 11/4094* (2013.01); *G11C 11/4097* (2013.01)

(58) Field of Classification Search
None
See application file for complete search history.

(56) References Cited

U.S. PATENT DOCUMENTS

| | | | |
|---|---|---|---|
| 6,295,227 B1 * | 9/2001 | Sakui ................. | G11C 8/14 257/E27.103 |
| 7,428,165 B2 | 9/2008 | Oowada | |
| 10,957,408 B1 * | 3/2021 | Jia ..................... | G11C 16/3427 |
| 10,971,231 B1 * | 4/2021 | Gautam ............... | G11C 16/10 |
| 2008/0158964 A1 * | 7/2008 | Ishibashi ............. | H01L 27/11529 365/185.13 |

(Continued)

FOREIGN PATENT DOCUMENTS

| | | |
|---|---|---|
| KR | 101431195 B1 | 8/2014 |
| KR | 1020190001057 A | 1/2019 |

*Primary Examiner* — J. H. Hur
(74) *Attorney, Agent, or Firm* — William Park & Associates Ltd.

(57) ABSTRACT

A semiconductor device includes a memory string connected between a source line and a bit line. The memory string includes first memory cells stacked along a first channel layer, second memory cells stacked along a second channel layer, and at least one switching memory cell connected between the first memory cells and the second memory cells. A method for operating the semiconductor device includes programming a selected first memory cell among the first memory cells, selecting a second memory cell to be programmed among the second memory cells, applying a program voltage to a word line connected to the selected second memory cell, turning off the switching memory cell such that the first channel layer and the second channel layer are electrically isolated from each other, and applying a pass voltage to word lines connected to unselected memory cells among the first and second memory cells.

18 Claims, 22 Drawing Sheets

(56) References Cited

U.S. PATENT DOCUMENTS

| | | | | |
|---|---|---|---|---|
| 2009/0180317 A1* | 7/2009 | Kang | .................. | G11C 11/5628 |
| | | | | 365/185.2 |
| 2012/0140562 A1* | 6/2012 | Choe | .................. | H01L 29/7926 |
| | | | | 365/185.18 |
| 2017/0076805 A1* | 3/2017 | Goda | ..................... | G11C 16/10 |
| 2017/0133099 A1* | 5/2017 | Hsu | ........................ | G11C 16/10 |
| 2017/0194058 A1* | 7/2017 | Yoon | ..................... | H01L 29/792 |
| 2017/0287566 A1* | 10/2017 | Sabde | ................. | G11C 11/5628 |
| 2018/0374541 A1* | 12/2018 | Jung | ...................... | G11C 16/08 |

\* cited by examiner

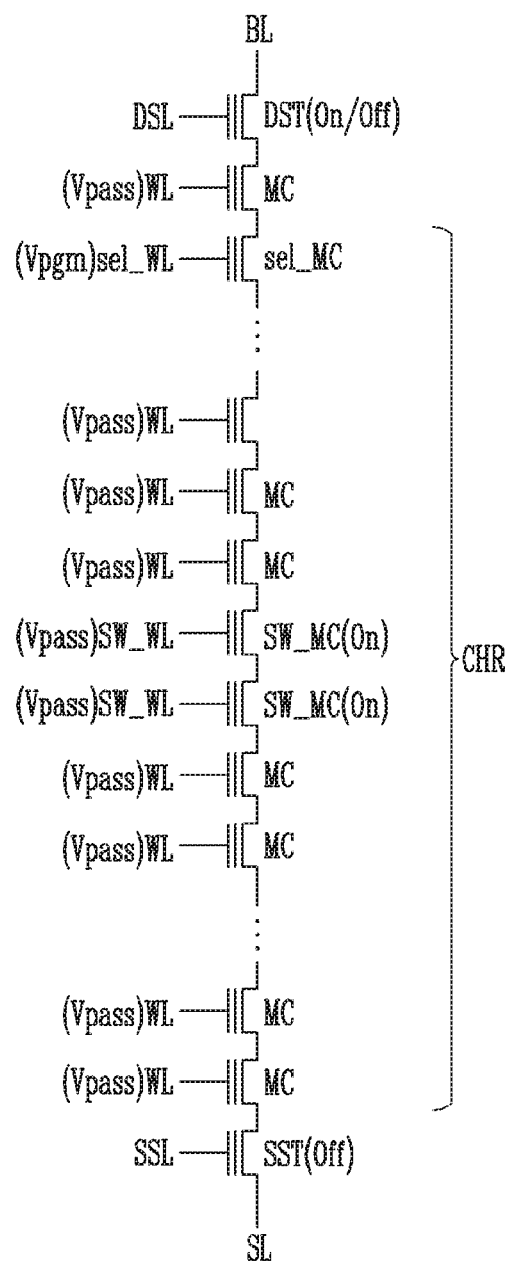

SEMICONDUCTOR MEMORY DEVICE WITH A SWITCHING MEMORY CELL IN A MEMORY STRING AND OPERATING METHOD THEREOF

CROSS-REFERENCE TO RELATED APPLICATION

The present application claims priority under 35 U.S.C. § 119(a) to Korean patent application number 10-2020-0035500, filed on Mar. 24, 2020, in the Korean Intellectual Property Office, the entire disclosure of which is incorporated herein by reference.

BACKGROUND

1. Technical Field

The present disclosure generally relates to an electronic device, and more particularly, to a semiconductor device and an operating method thereof.

2. Related Art

A semiconductor device may include a memory device configured to store data or output stored data. The memory device may be a volatile memory device in which stored data disappears when the supply of power is interrupted. The volatile memory device may be a Static RAM (SRAM) device, a Dynamic RAM (DRAM) device, a Synchronous DRAM (SDRAM) device, etc. Alternatively, the memory device may be a nonvolatile memory device in which stored data is retained even when the supply of power is interrupted. The nonvolatile memory device may be a Read Only Memory (ROM) device, a Programmable ROM (PROM) device, an Electrically Programmable ROM (EPROM) device, an Electrically Erasable and Programmable ROM (EEPROM) device, a flash memory device, a Phase-change RAM (PRAM) device, a Magnetic RAM (MRAM) device, a Resistive RAM (RRAM) device, a Ferroelectric RAM (FRAM) device, etc.

The memory device may include a memory cell array configured to store data; a peripheral circuit configured to perform various operations such as a program operation, a read operation, and an erase operation; and control logic configured to control the peripheral circuit. The memory device may be implemented in a structure in which memory cells are two-dimensionally arranged above a substrate or a structure in which memory cells are three-dimensionally stacked above a substrate.

SUMMARY

Some embodiments provide a semiconductor device having improved operating characteristics and an operating method of the semiconductor device.

In accordance with an aspect of the present disclosure, there is provided a method for operating a semiconductor device including a memory string connected between a source line and a bit line, wherein the memory string includes first memory cells stacked along a first channel layer, second memory cells stacked along a second channel layer; and at least one switching memory cell connected between the first memory cells and the second memory cells. The method includes programming a selected first memory cell among the first memory cells, selecting a second memory cell to be programmed among the second memory cells, applying a program voltage to a word line connected to the selected second memory cell, turning off the switching memory cell such that the first channel layer and the second channel layer are electrically isolated from each other, and applying a pass voltage to word lines connected to unselected memory cells among the first memory cells and the second memory cells.

In accordance with another aspect of the present disclosure, there is provided a method for operating a semiconductor device including a memory string connected between a source line and a bit line, wherein the memory string includes memory cells stacked along a first channel layer and a second channel layer and at least one switching memory cell located in a connection region of the first channel layer and the second channel layer. The method includes programming first to kth memory cells among the memory cells, and turning on the switching memory cell such that the first channel layer and the second channel layer are electrically connected to each other when the first to kth memory cells are programmed, wherein k is an integer of 2 or more. The method also includes selecting a (k+1)th memory cell among the memory cells, applying a program voltage to a word line connected to the (k+1)th memory cell, turning off the switching memory cell such that the first channel layer and the second channel layer are electrically isolated from each other, and applying a pass voltage to word lines connected to unselected memory cells among the memory cells.

In accordance with still another aspect of the present disclosure, a semiconductor device includes a memory string connected between a source line and a bit line, the memory string including first memory cells stacked along a first channel layer, second memory cells stacked along a second channel layer, and at least one switching memory cell connected between the first memory cells and the second memory cells. The semiconductor device also includes a peripheral circuit configured to perform a program operation on the memory string. The semiconductor device further includes a control logic circuit configured to control the peripheral circuit to program a selected first memory cell among the first memory cells, to select a second memory cell to be programmed among the second memory cells, to apply a program voltage to a word line connected to the selected second memory cell, to turn off the switching memory cell such that the first channel layer and the second channel layer are electrically isolated from each other, and to apply a pass voltage to word lines connected to unselected memory cells among the first memory cells and the second memory cells.

BRIEF DESCRIPTION OF THE DRAWINGS

Example embodiments will now be described with reference to the accompanying drawings; however, they may be embodied in different forms and should not be construed as limited to the embodiments set forth herein. Rather, these embodiments are provided so that this disclosure will be enabling to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIGS. 6, 7A, and 7B are diagrams illustrating an operating method of the semiconductor memory device in accordance with an embodiment of the present disclosure.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

Figure 1:
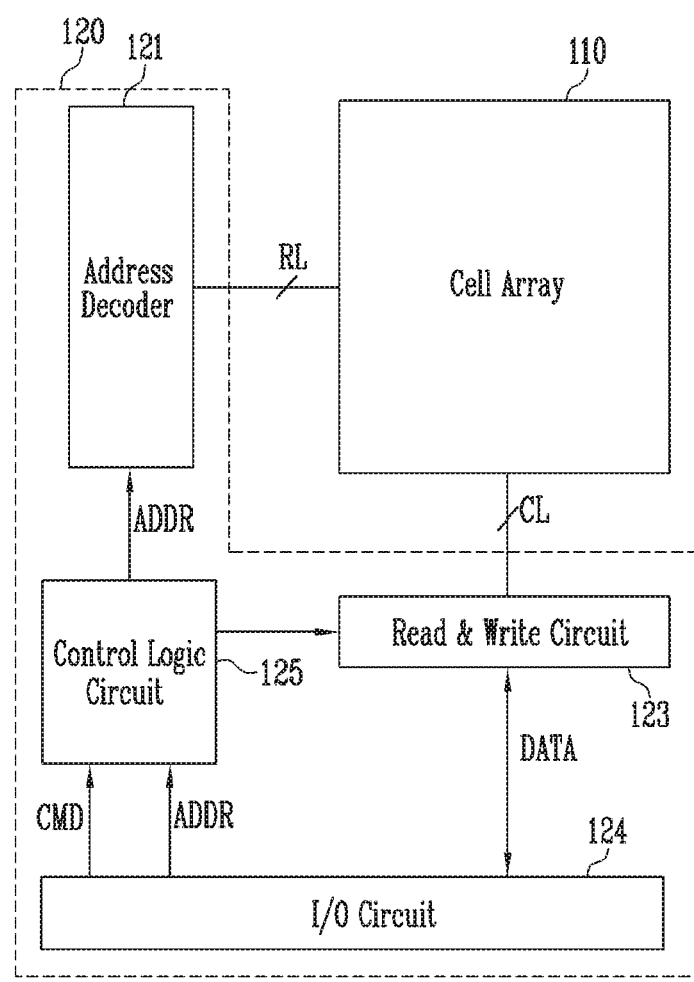
FIG. 1 is a block diagram illustrating a configuration of a semiconductor device in accordance with an embodiment of the present disclosure.

FIG. 1 is a block diagram illustrating a configuration of a semiconductor device in accordance with an embodiment of the present disclosure.

Referring to FIG. 1, the semiconductor device 100 may include a cell array 110 and a peripheral circuit 120. The peripheral circuit 120 may include an address decoder 120, a read & write circuit 123, an input/output (I/O) circuit 124, and a control logic circuit 125. The semiconductor device 100 may be a memory device, and be a volatile memory device or a nonvolatile memory device. For example, the semiconductor device 100 may be a flash memory device.

The cell array 110 may be connected to the address decoder 121 through row lines RL, and be connected to the read & write circuit 123 through column lines CL. The row lines RL may be word lines, and the column lines CL may be bit lines. However, the word lines and the bit lines are relative concepts. The row lines may be bit lines, and the column lines may be word lines.

The cell array 110 may include a plurality of memory strings, and the memory strings may be arranged in a horizontal direction or a vertical direction above a substrate. Also, the cell array 110 may include a plurality of memory blocks, and each of the memory blocks may include a plurality of pages.

The control logic circuit 125 may be connected to the address decoder 121, the read & write circuit 123, and the I/O circuit 124. The control logic circuit 125 may receive a command CMD and an address ADDR from the I/O circuit 124, and control the address decoder 121 and the read & write circuit 123 to perform an internal operation according to the received command CMD, The control logic circuit 125 may be implemented as hardware, software, or a combination of hardware and software. For example, the control logic circuit 125 may be a circuit operating in accordance with an algorithm and/or a processor executing control logic code.

The address decoder 121 may be connected to the cell array 110 through the row lines RL. For example, the address decoder 121 may be connected to the cell array 110 through a word line, a dummy word line, a source select line, and a drain select line. Also, the address decoder 121 may control the row lines RL under the control of the control logic circuit 125. Therefore, the address decoder 121 may receive an address ADDR from the control logic circuit 125, and select any one of the memory blocks of the cell array 110 according to the received address ADDR.

A program operation and a read operation of the semiconductor device 100 may be performed in a unit of a page. Therefore, in the program operation and the read operation, an address ADDR may include a block address and a row address. The address decoder 121 may decode a block address in the received address ADDR, and select one memory block according to the decoded block address. The address decoder 121 may decode a row address in the received address ADDR, and select any one page of the selected memory block according to the decoded row address.

An erase operation of the semiconductor device 100 may be performed in a unit of a memory block. Therefore, in the erase operation, an address ADDR may include a block address. The address decoder 121 may decode a block address, and select one memory block according to the decoded block address.

The read & write circuit 123 may be connected to the cell array 110 through the column lines CL. In a program operation, the read & write circuit 123 may transfer data DATA received from the I/O circuit 124, and memory cells of a selected page may be programmed according to the transferred data DATA. The data DATA may be multi-bit data to be respectively programmed to the memory cells. In a read operation, the read & write circuit 123 may read data DATA from the memory cells of the selected page through the column lines CL, and output the read data DATA to the I/O circuit 124. In an erase operation, the read & write circuit 123 may float the column lines CL. A verify operation may be included in the program operation and the erase operation. The verify operation may be performed in a manner similar to that of the read operation.

Figure 2:
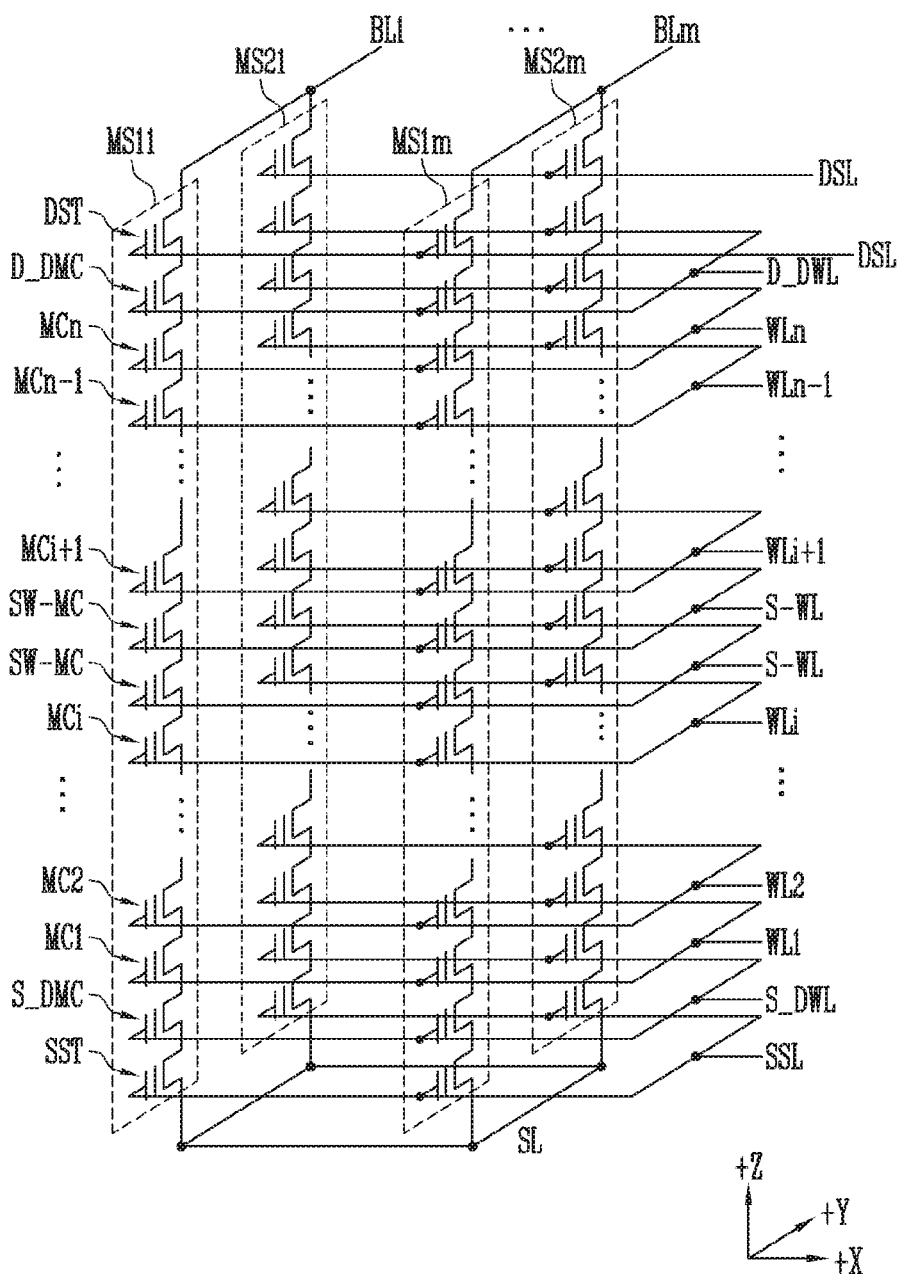
FIGS. 2 and 3 are circuit diagrams illustrating a cell array structure of the semiconductor device in accordance with an embodiment of the present disclosure.
Figure 3:
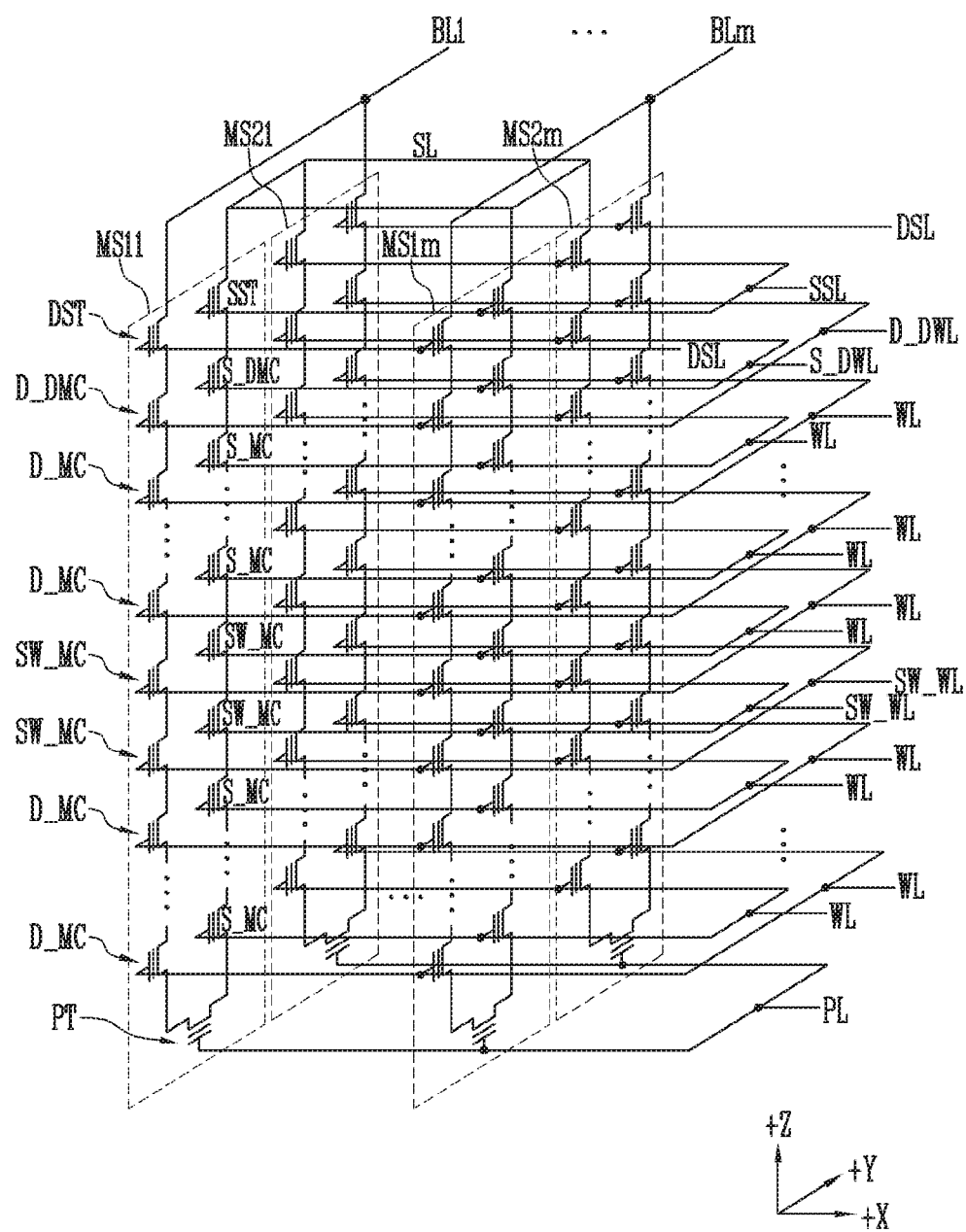

FIGS. 2 and 3 are circuit diagrams illustrating a cell array structure of the semiconductor device in accordance with an embodiment of the present disclosure.

Referring to FIG. 2, the cell array may include a plurality of memory blocks BLK, and each of the memory blocks BLK may include a plurality of memory strings MS11 to MS1$m$ and MS21 to MS2$m$. The plurality of memory strings MS11 to MS1$m$ and MS21 to MS2$m$ may be connected between bit lines BL1 to BL$m$ and a source line SL. Also, each of the memory strings MS11 to MS1m and MS21 to MS2m may extend along a +Z direction. The +Z direction may be a direction in which memory cells MC1 to MCn are stacked. Here, m is an integer of 2 or more.

Each of the memory strings MS11 to MS1m and MS21 to MS2m may include at least one source select transistor SST, a plurality of memory cells MC1 to MCn, at least one switching memory cell SW_MC, and at least one drain select transistor DST. Here, n is an integer of 2 or more.

Each of the memory strings MS11 to MS1m and MS21 to MS2m may further include at least one source-side dummy memory cell S_DMC connected between the source select transistor SST and the memory cell MC1. Each of the memory strings MS11 to MS1m and MS21 to MS2m may further include at least one drain-side dummy memory cell D_DMC connected between the drain select transistor DST and the memory cell MCn.

At least one source select transistor SST included in one of the memory strings MS11 to MS1m and MS21 to MS2m may be connected in series between the memory cell MC1 and the source line SL. Gate electrodes of the source select transistors SST may be connected to at least one source select line SSL. In addition, source select transistors SST at the same level may be connected to the same source select line SSL.

Memory cells MC1 to MCn included in one of the memory strings MS11 to MS1m and MS21 to MS2m may be connected in series between the source select transistor SST and the drain select transistor DST. Gate electrodes of the memory cells MC1 to MCn may be connected to word lines WL1 to WLn, and memory cells at the same level may be connected to the same word line. Word line voltages (a program bias, a pre-program bias, a read bias, and the like) used for driving may be applied to each of the word lines WL1 to WLn.

At least one drain select transistor DST included in one of the memory strings MS11 to MS1m and MS21 to MS2m may be connected in series between the bit lines BL1 to BLm and the memory cell MCn. Gate electrodes of the drain select transistors DST may be connected to at least one drain select line DSL. Drain select transistors DST at the same level among the drain select transistors DST of the memory strings (MS11 to MS1m or MS21 to MS2m) arranged on the same row (+X direction) may be connected to the same drain select line DSL. In addition, drain select transistors DST arranged on different rows (+X direction) may be connected to different drain select lines DSL.

At least one switching memory cells SW_MC included in one of the memory strings MS11 to MS1m and MS21 to MS2m may be connected between a memory cell MCi and a memory cell MCi+1. Here, i is an integer of 2 or more. A gate electrode of the switching memory cell SW_MC may be connected to at least one switching word line SW_WL, and switching memory cells SW_MC at the same level may be connected to the same switching word line SW_WL. Word line voltages (an isolation voltage, a pass voltage, and the like) used for driving may be applied to the switching word line SW_WL.

At least one source-side dummy memory cell S_DMC included in one of the memory strings MS11 to MS1m and MS21 to MS2m may be connected in series between the source select transistor SST and the memory cell MC1. A gate electrode of the source-side dummy memory cell S_DMC may be connected to at least one source-side dummy word line S_DWL, and source-side dummy memory cells S_DMC may be connected to the same source-side dummy word line S_DWL. Word line voltages (a program voltage, a read voltage, a pass voltage, and the like) used for driving may be applied to the source-side dummy word line S_DWL.

At least one drain-side dummy memory cell D_DMC included in one of the memory strings MS11 to MS1m and MS21 to MS2m may be connected in series between the drain select transistor DST and the memory cell MCn. A gate electrode of the drain-side dummy memory cell D_DMC may be connected to at least one drain-side dummy word line D_DWL, and drain-side dummy memory cells D_DMC may be connected to the same drain-side dummy word line D_DWL. Word line voltages (a program voltage, a read voltage, a pass voltage, and the like) used for driving may be applied to the drain-side dummy word line D_DWL.

Referring to FIG. 3, the memory block BLK may include a plurality of memory strings MS11 to MS1m and MS21 to MS2m. Each of the memory strings MS11 to MS1m and MS21 to MS2m may include at least one source select transistor SST, a plurality of source-side memory cells S_MC, at least one pipe transistor PT, a plurality of drain-side memory cells D_MC, at least one drain select transistor DST, and at least one switching memory cells SW_MC, which are connected in series. Also, each of the memory strings MS11 to MS1m and MS21 to MS2m may further include at least one source-side dummy memory cell S_DMC or at least one drain-side dummy memory cell D_DMC. Each of the memory strings MS11 to MS1m and MS21 to MS2m may be arranged in a 'U' shape such that both ends of each memory string point in a similar or same direction.

The pipe transistor PT may connect the drain-side memory cells D_MC and the source-side memory cells S_MC. In addition, a gate of the pipe transistor PT of each of the memory strings MS11 to MS1m and MS21 to MS2m may be connected to a pipe line PL. The other structure is similar to that described with reference to FIG. 2, and therefore, overlapping descriptions will be omitted.

Figure 4A:
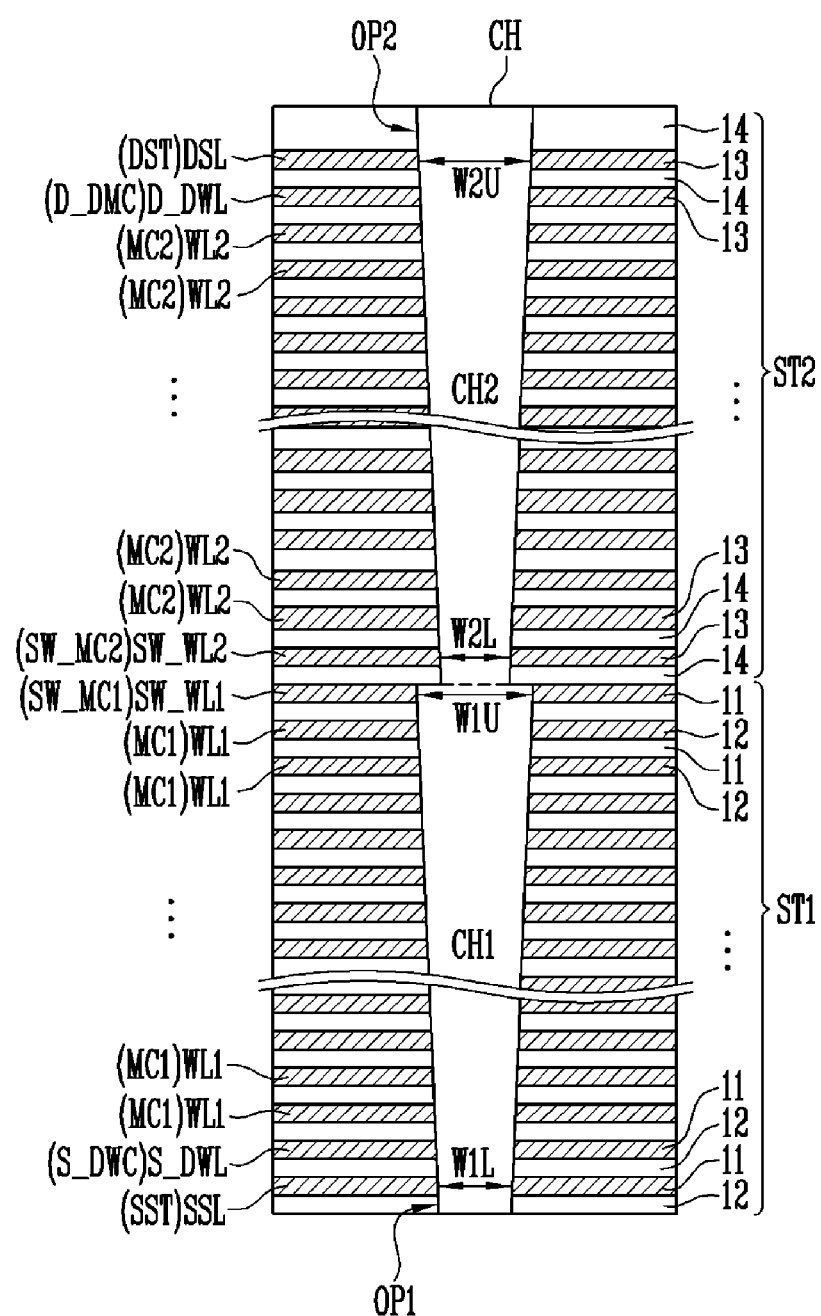
FIGS. 4A and 4B are diagrams illustrating a structure of the semiconductor memory device in accordance with an embodiment of the present disclosure.
Figure 4B:
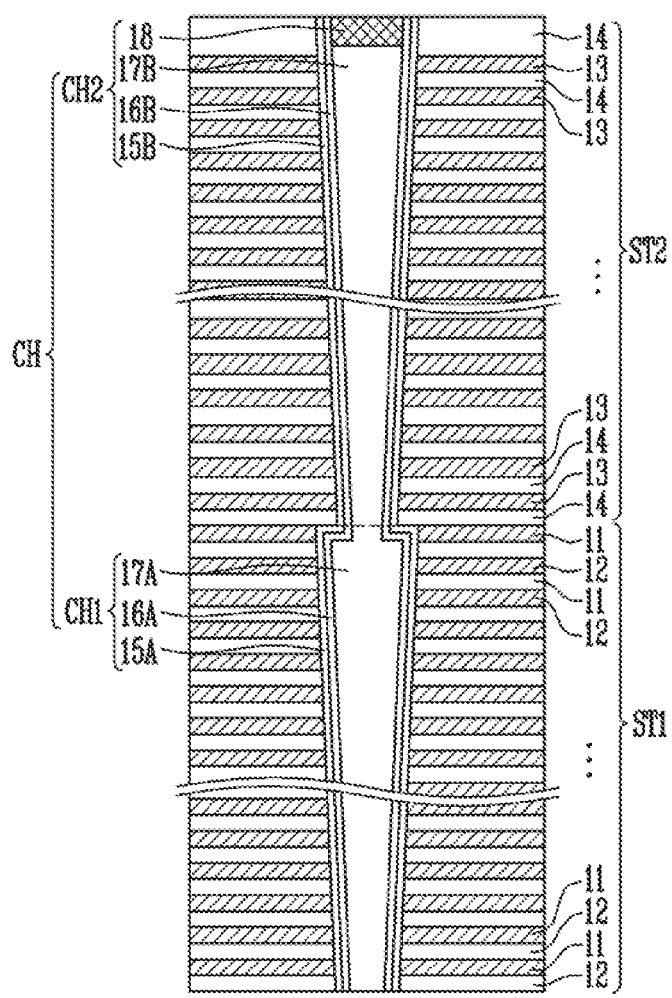

FIGS. 4A and 4B are diagrams illustrating a structure of the semiconductor memory device in accordance with an embodiment of the present disclosure. Hereinafter, descriptions of contents overlapping with those described above will be omitted.

Referring to FIG. 4A, the semiconductor device in accordance with the embodiment of the present disclosure may include a first stack structure ST1, a second stack structure ST2, and a channel structure CH.

The first stack structure ST1 may include first conductive layers 11 and first insulating layers 12, which are alternately stacked. The first conductive layers 11 may be gate electrodes of a select transistor, a memory cell, and the like. The first conductive layers 11 may include a conductive material such as poly-silicon, tungsten, or metal. The first insulating layers 12 are used to insulate the stacked first conductive layers 11 from each other, and may include an insulating material such as oxide or nitride.

The second stack structure ST2 may be located on the top or bottom of the first stack structure ST1. The second stack structure ST2 may include second conductive layers 13 and second insulating layers 14, which are alternately stacked. The second conductive layers 13 may be gate electrodes of a select transistor, a memory cell, and the like. The second conductive layers 13 may include a conductive material such as poly-silicon, tungsten, or metal. The second insulating layers 14 are used to insulate the stacked second conductive layers 13 from each other, and may include an insulating material such as oxide or nitride.

The first stack structure ST1 may include a first opening OP1, and the second stack structure ST2 may include a second opening OP2. The second opening OP2 may be connected to the first opening OP1. The first opening OP1 and the second opening OP2 may have a tapered section. The first opening OP1 may have a width wider than that of the second opening OP2 at an interface between the first stack structure ST1 and the second stack structure ST2.

At least one conductive layer located at a boundary between the first stack structure ST1 and the second stack structure ST2 among the first conductive layers 11 and the second conductive layers 13 may correspond to switching word lines SW_WL1 and SW_WL2. The switching word lines SW_WL1 and SW_WL2 may be located at a portion at which a width of the channel structure CH is rapidly changed. At least one uppermost first conductive layer 11 among the first conductive layers 11 may correspond to a first switching word line SW_SWL1, and at least one lowermost second conductive layer 13 among the second conductive layers 13 may correspond to a second switching word line SW_WL2.

At least one uppermost first conductive layer 11 among the first conductive layers 11 may correspond to a source select line SSL. At least one lowermost second conductive layer 13 among the second conductive layers 13 may correspond to a drain select line DSL.

The other first conductive layers 11 except the source select line SSL and the first switching word line SW_WL1 among the first conductive layers 11 may be first word lines WL1. The other second conductive layers 13 except the drain select line DSL and the second switching word line SW_WL2 among the second conductive layers 13 may be second word lines WL2.

A drain side and a source side are relative concepts. At least one uppermost first conductive layer 11 may correspond to the drain select line DSL, and at least one lowermost second conductive layer 13 may correspond to the source select line SSL. In addition, the second stack structure ST2 may further include at least one drain-side dummy word line D_DWL located between the drain select line DSL and the second word lines WL2. The first stack structure ST1 may further include at least one source-side dummy word line S_DWL located between the source select line SSL and the first word lines WL1.

The channel structure CH may penetrate the first stack structure ST1 and the second stack structure ST2. The channel structure CH may be formed in the first opening OP1 and the second opening OP2. One channel structure CH may be formed in the first opening OP1 and the second opening OP2, which are connected to each other. The channel structure CH may include a first channel structure CH1 corresponding to the first opening OP1 and a second channel structure CH2 corresponding to the second opening OP2. The first channel structure CH1 may be adjacent to a source line, and the second channel structure CH2 may be adjacent to a bit line.

A lower portion of the first channel structure CH1 may have a width narrower than that of an upper portion of the first channel structure CH1 (W1L<W1U), In other words, the first channel structure CH1 may have a relatively wide width at the boundary between the first stack structure ST1 and the second stack structure ST2, and a source side of the first channel structure CH1 may have a relatively narrow width. A lower portion of the second channel structure CH2 may have a width narrower than that of an upper portion of the second channel structure CH2 (W2L<W2U). In other words, the second channel structure CH2 may have a relatively narrow width at the boundary between the first stack structure ST1 and the second stack structure ST2, and a drain side of the second channel structure CH2 may have a relatively wide width.

A source select transistor SST may be located at a portion at which the first channel structure CH1 and the source select line SSL intersect each other. A source-side dummy memory cell S_DMC may be located at a portion at which the first channel structure CH1 and the source-side dummy word line S_DWL intersect each other. A drain select transistor DST may be located at a portion at which the second channel structure CH2 and the drain select line DSL intersect each other. A drain-side dummy memory cell D_DMC may be located at a portion at which the second channel structure CH2 and the drain-side dummy word line D_DWL intersect each other.

First memory cells MC1 may be located at portions at which the first channel structure CH1 and the first word lines WL1 intersect each other. Second memory cells MC2 may be located at portions at which the second channel structure CH2 and the second word lines WL2 intersect each other. A first switching memory cell SW_MC1 may be located at a portion at which the first channel structure CH1 and the first switching word line SW_WL1 intersect each other. A second switching memory cell SW_MC2 may be located at a portion at which the second channel structure CH2 and the second switching word line SW_WL2 intersect each other. The first and second switching memory cells SW_MC1 and SW_MC2 may be located in a connection region of the first channel structure CH1 and the second channel structure CH2. The first and second switching memory cells SW_MC1 and SW_MC2 may be connected in series between the first memory cells MC1 and the second memory cells MC2.

At least one source select transistor SST, at least one source-side dummy memory cell S_DMC, the first memory cells MC1, at least one switching memory cell SW_MC1 and SW_MC2, the second memory cells MC2, at least one drain-side dummy memory cell D_DMC, and at least one drain select transistor DST, which share the channel structure CH, may constitute one memory string.

Referring to FIGS. 4A and 4B, the first channel structure CH1 may include a first channel layer 16A, and further include at least one of a first memory layer 15A and a first gap fill layer 17A. The second channel structure CH2 may include a second channel layer 16B, and further include at least one of a second memory layer 15B, a second gap fill layer 17B, and a pad 18. The first channel layer 16A and the second channel layer 16B correspond to a region for forming a channel of a select transistor, a memory cell, etc. The first channel layer 16A and the second channel layer 16B may include a semiconductor material such as silicon (Si) or germanium (Ge), or include a nano structure material such as nano dots, nano tubes, or graphene. In an embodiment, the first channel layer 16A and the second channel layer 16B may be formed through processes separate from each other. The second channel structure CH2 may further include a pad, and the first channel layer 16A and the second channel layer 16B may be electrically connected to each other through the pad. The first channel layer 16A and the second channel layer 16B may be formed through the same process, and be connected to each other without any interface.

Each of the first memory layer 15A and the second memory layer 15B may include at least one of a tunnel insulating layer, a data storage layer, and a blocking layer. The data storage layer may be used substantially for data storage, and include a floating gate, a charge trap material, poly-silicon, nitride, a variable resistance material, a phase change material, etc. The first memory layer 15A and the second memory layer 15B may be formed through processes separate from each other, and be connected to each other through an interface. The first memory layer 15A and the second memory layer 15B may be formed through the same process, and be connected to each other without any interface.

The first gap fill layer 17A may be formed in the first channel layer 16A. The second gap fill layer 17B may be formed in the second channel layer 16B. The first gap fill layer 17A and the second gap fill layer 17B may include oxide, etc. The pad 18 may be connected to the second channel layer 16B, and include a conductive material. The second channel layer 16B may be connected to a line such as a bit line or a source line through the pad 18.

According to the structure described above, the first memory cells MC1 may be stacked along the first channel layer 16A, and the second memory cells MC2 may be stacked along the second channel layer 16B. In addition, at least one switching memory cell SW_MC1 and SW_MC2 may be located in a connection region of the first channel layer 16A and the second channel layer 16B. The first switching memory cell SW_MC1 and the second switching memory cell SW_MC2 are consecutively disposed, but a width difference between the first channel layer 16A and the second channel layer 16B is large. Therefore, the first switching memory cell SW_MC1 and the second switching memory cell SW_MC2 do not used as a substantial data storage, but may be used as a switch for electrically isolating or connecting the first channel layer 16A and the second channel layer 16B from or to each other.

Meanwhile, although a case where the semiconductor device includes the first stack structure ST1 and the second stack structure ST2 has been described in this embodiment, the semiconductor device may include three or more stack structures. At least one switching word line SW_WL1 and SW_WL2 may be located at each of boundaries between the stack structures. Although a case where the second stack structure ST2 is located on the top of the first stack structure ST1 has been described, the first stack structure ST1 may be located on the top of the second stack structure ST2. The upper portion of the first channel structure CH1 may have a width narrower than that of the lower portion of the first channel structure CH1.

Figure 5A:
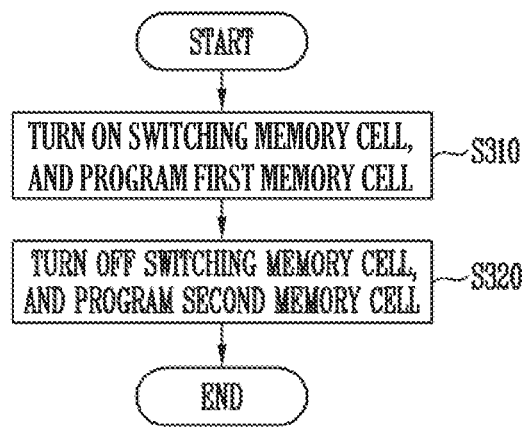
FIGS. 5A and 5B are flowcharts illustrating an operating method of the semiconductor memory device in accordance with an embodiment of the present disclosure.
Figure 5B:
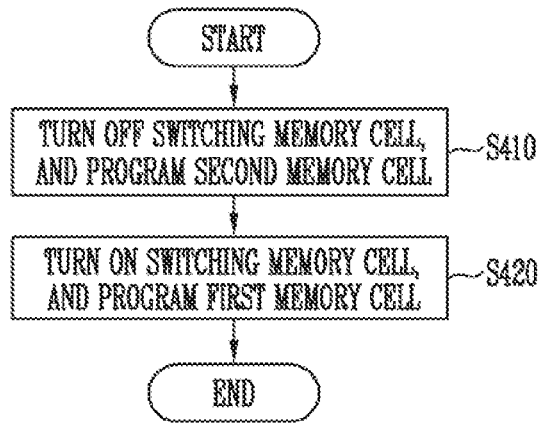

FIGS. 5A and 5B are flowcharts illustrating an operating method of the semiconductor memory device in accordance with an embodiment of the present disclosure. Hereinafter, a program operation method of the memory string described with reference to FIG. 4A or 4B will be described.

Referring to FIG. 5A, a selected first memory cell MC1 among the first memory cells MC1 is programmed (S310). The selected first memory cell MC1 may be programmed by using a normal program operation. In the normal program operation, the switching memory cells SW_MC1 and SW_MC2 are turned on, so that the first channel layer 16A and the second channel layer 16B are electrically connected to each other. The normal program operation will be described in detail with reference to FIG. 7A.

Subsequently, a selected second memory cell MC2 among the second memory cells MC2 is programmed (S320). The selected second memory cell MC2 may be programmed by using a disturbance compensation program operation. In the disturbance compensation program operation, the switching memory cells SW_MC1 and SW_MC2 are turned off, so that the first channel layer 16A and the second channel layer 16B are electrically isolated from each other. The disturbance compensation program operation will be described in detail with reference to FIG. 7B.

According to the operating method described above, after the first memory cells MC1 are programmed, the second memory cells MC2 may be programmed. When the second memory cell MC2 is programmed, the first channel layer 16A and the second channel layer 16B are isolated from each other, so that channel boosting of the second channel layer 16B can be improved. Thus, a disturbance caused in a program operation can be minimized.

Referring to FIG. 5B, a selected second memory cell MC2 among the second memory cells MC2 is programmed (S410). The selected second memory cell MC2 may be programmed by using a disturbance compensation program operation. In the disturbance compensation program operation, the switching memory cells SW_MC1 and SW_MC2 are turned off, so that the first channel layer 16A and the second channel layer 16B are electrically isolated from each other.

Subsequently, a selected first memory cell MC1 among the first memory cells MC1 is programmed (S420). The selected first memory cell MC1 may be programmed by using a normal program operation. In the normal program operation, the switching memory cells SW_MC1 and SW_MC2 are turned on, so that the first channel layer 16A and the second channel layer 16B are electrically connected to each other.

According to the operating method described above, after the second memory cells MC2 are programmed, the first memory cells MC1 may be programmed. When the second memory cells MC2 is programmed, the first channel layer 16A and the second channel layer 16B may be isolated from each other. Also, when the second memory cell MC2 is programmed, a pass voltage applied to the first word lines WL1 is decreased, so that stress applied to the first memory cells MC1 can be reduced. Thus, a disturbance caused in a program operation can be minimized.

Meanwhile, the disturbance compensation program operation may be performed on all the second memory cells MC2, or be performed on only some second memory cells MC2 among the second memory cells MC2. When the disturbance compensation program operation is performed on some second memory cells MC2, the normal program operation may be performed on the other second memory cells MC2. Some second memory cells MC2 on which the disturbance compensation program operation is to be performed may be determined by considering a factor that causes a disturbance.

Figure 6:
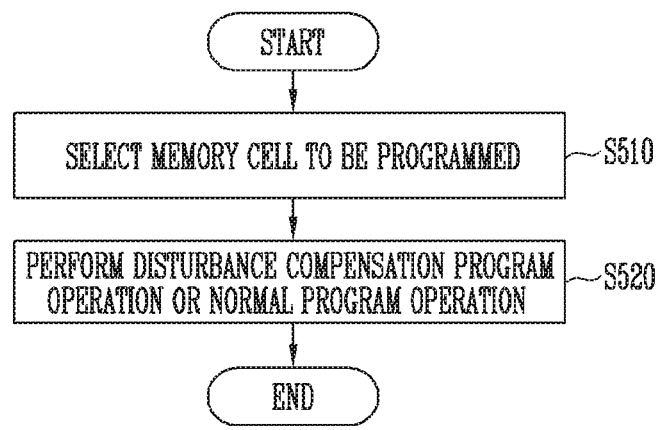
Figure 7B:
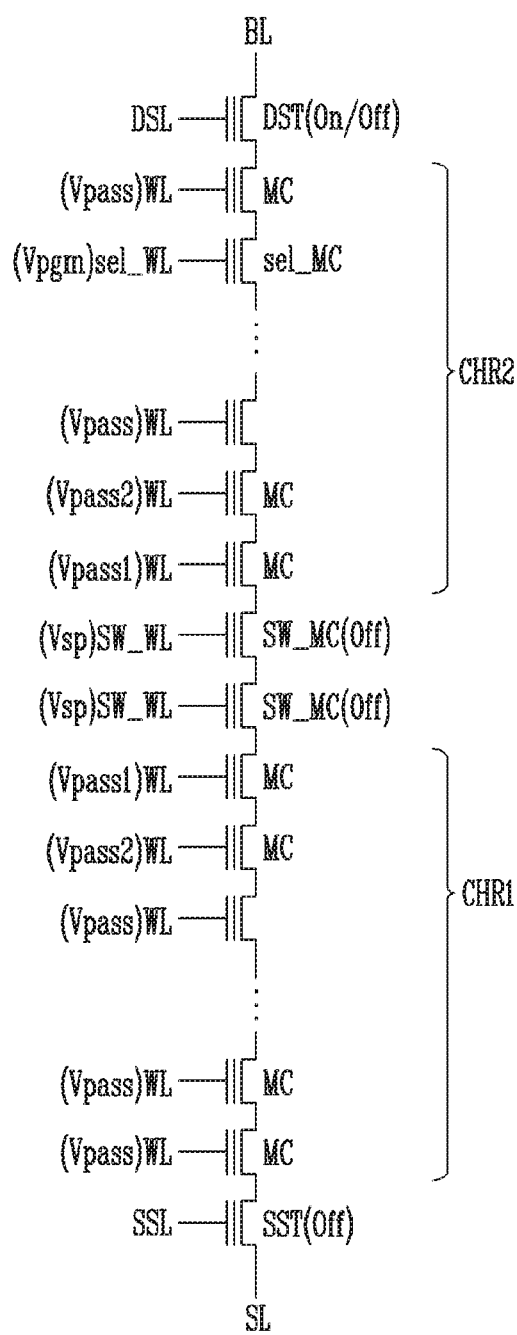

FIGS. 6, 7A, and 7B are diagrams illustrating an operating method of the semiconductor memory device in accordance with an embodiment of the present disclosure. FIG. 6 is a flowchart, and FIGS. 7A and 7B illustrate a memory string and bias conditions. The memory string shown in FIGS. 7A and 7B may be included in the cell array described with reference to FIG. 2 or 3.

Referring to FIG. 6, a memory cell or a page, on which a program operation is to be performed, is selected (S510). A word line corresponding to a logical page on which the program operation is to be performed may be selected. Subsequently, a normal program operation or a disturbance compensation program operation is performed on the selected memory cell Sel_MC (S520). A program method may be determined by considering a disturbance caused in the program operation. The normal program operation or the disturbance compensation program operation may be selected by considering a shape of a channel layer, a width of the channel layer, a program order, a program advancing direction, etc.

Program disturbance exists as the disturbance caused in the program operation. When the program operation is sequentially performed on stacked word lines, a channel region of a program-inhibited memory string may be sufficiently boosted, because a number of memory cells MC having a program state in the memory string is small at an early stage of program. However, because the number of memory cells MC having the program state in the memory string becomes large as the program advances, the boosting of the channel region may be reduced. Such a phenomenon is referred to as the program disturbance. It is highly likely that a memory cell MC for which a program order is late will be degraded by the program disturbance as compared with a memory cell MC for which a program order is early. That is, a memory cell MC included in the last page according to the program order is most weak to the program disturbance.

Pass disturbance exists as the disturbance caused in the program operation. A pass voltage Vpass is applied to unselected word lines WL. Also, the pass voltage Vpass may be repeatedly applied to word lines WL, as the program operation is repeatedly performed. Therefore, memory cells MC may receive stress as the program operation is repeatedly performed. Such a phenomenon is referred to as the pass disturbance. However, as described with reference to FIGS. 4A and 4B, when the channel structure CH has a tapered section, a memory cell MC exists, which includes a channel layer having a relatively narrow width. As compared with a memory cell MC including a channel layer having a wide width, a memory cell MC including a channel layer having a narrow width is influenced by large pass disturbance, even when the pass voltage Vpass is applied the same number of times. That is, the memory cell including the channel layer having the narrow width is most weak to the pass disturbance.

In addition, the program advancing direction may have influence on the disturbance. When program advances from a source side to a drain side of the channel structure CH, the second memory cells MC2 including the second channel layer 16B have a program order later than that of the first memory cells MC1 including the first channel layer 16A. Therefore, the second memory cells MC2 may be weak to the program disturbance. When the program advances from the drain side to the source side of the channel structure CH, the first memory cells MC1 including the first channel layer 16A have a program order later than that of the second memory cells MC2 including the second channel layer 16B. In addition, because memory cells for which a program order is late among the first memory cells MC1 including the first channel layer 16A have a narrow channel width, the memory cells may be weak to the pass disturbance.

Therefore, when the program advances from the source side to the drain side of the channel structure CH, the disturbance compensation program operation may be performed to minimize the program disturbance. When the program advances from the drain side to the source side of the channel structure CH, the disturbance compensation program operation may be performed to minimize the pass disturbance.

FIG. 7A illustrates the normal program operation. Referring to FIG. 7A, the memory string and the source line SL are isolated from each other by turning off the source select transistor SST. A selected drain select transistor DST is turned on, and an unselected drain select transistor DST is turned off. A program voltage Vpgm is applied to a selected word line sel_WL, and a pass voltage Vpass is applied to unselected word lines WL and the switching word line SW_WL. The pass voltage Vpass may have a level lower than that of the program voltage Vpgm. According to this method, because the switching memory cell SW_MC is turned on, a channel region at one side of the switching memory cell SW_MC and a channel region at the other side of the switching memory cell SW_MC are connected to each other. That is, the first channel layer 16A and the second channel layer 16B are electrically connected to each other, and one channel region CHR is formed in the channel structure CH.

FIG. 7B illustrates the disturbance compensation program operation. Referring to FIG. 7B, the memory string and the source line SL are isolated from each other by turning off the source select transistor SST. A selected drain select transistor DST is turned on, and an unselected drain select transistor DST is turned off. A program voltage Vpgm is applied to a selected word line sel_WL, and pass voltages Vpass, Vpass1, and Vpass2 are applied to unselected word lines WL. The pass voltages Vpass, Vpass1, and Vpass2 may have a level lower than that of the program voltage Vpgm. The switching memory cell SW_MC is turned off by applying an isolation voltage Vsp to the switching word line SW_WL. The isolation voltage Vsp may have a ground level or have a negative level. Accordingly, a channel region at one side of the switching memory cell SW_MC and a channel region at the other side of the switching memory cell SW_MC are isolated from each other. A first channel region CHR1 formed in the first channel layer 16A and a second channel region CHR2 formed in the second channel layer 16B are electrically isolated from each other. Thus, the boosting level of the second channel region CHR2 can be increased, and the program disturbance can be minimized.

In an embodiment, pass voltages Vpass1 and Vpass2 applied to memory cells MC adjacent to the switching memory cell SW_MC and a pass voltage Vpass applied to memory cells which are not adjacent to the switching memory cell SW_MC may have different levels. A first pass voltage Vpass1 may be applied to a first adjacent memory cell MC adjacent to the switching memory cell SW_MC, and a second pass voltage Vpass2 may be applied to a second adjacent memory cell MC adjacent to the first adjacent memory cell MC. The second pass voltage Vpass2 may have a level higher than that of the first pass voltage Vpass1, and have a level lower than that of the pass voltage Vpass (Vpass1<Vpass2<Vpass). Accordingly, a channel voltage can be prevented from being rapidly increasing between the switching memory cell SW_MC and the memory cells MC.

Figure 8A:
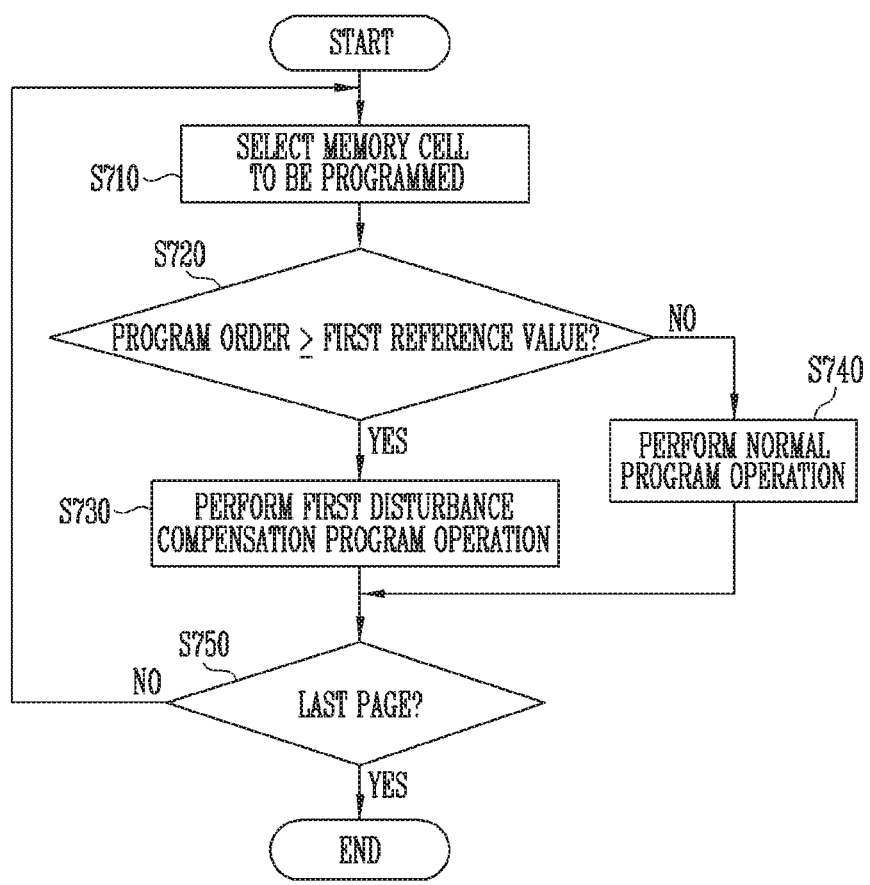
FIGS. 8A and 8B are diagrams illustrating an operating method of the semiconductor memory device in accordance with an embodiment of the present disclosure.
Figure 8B:
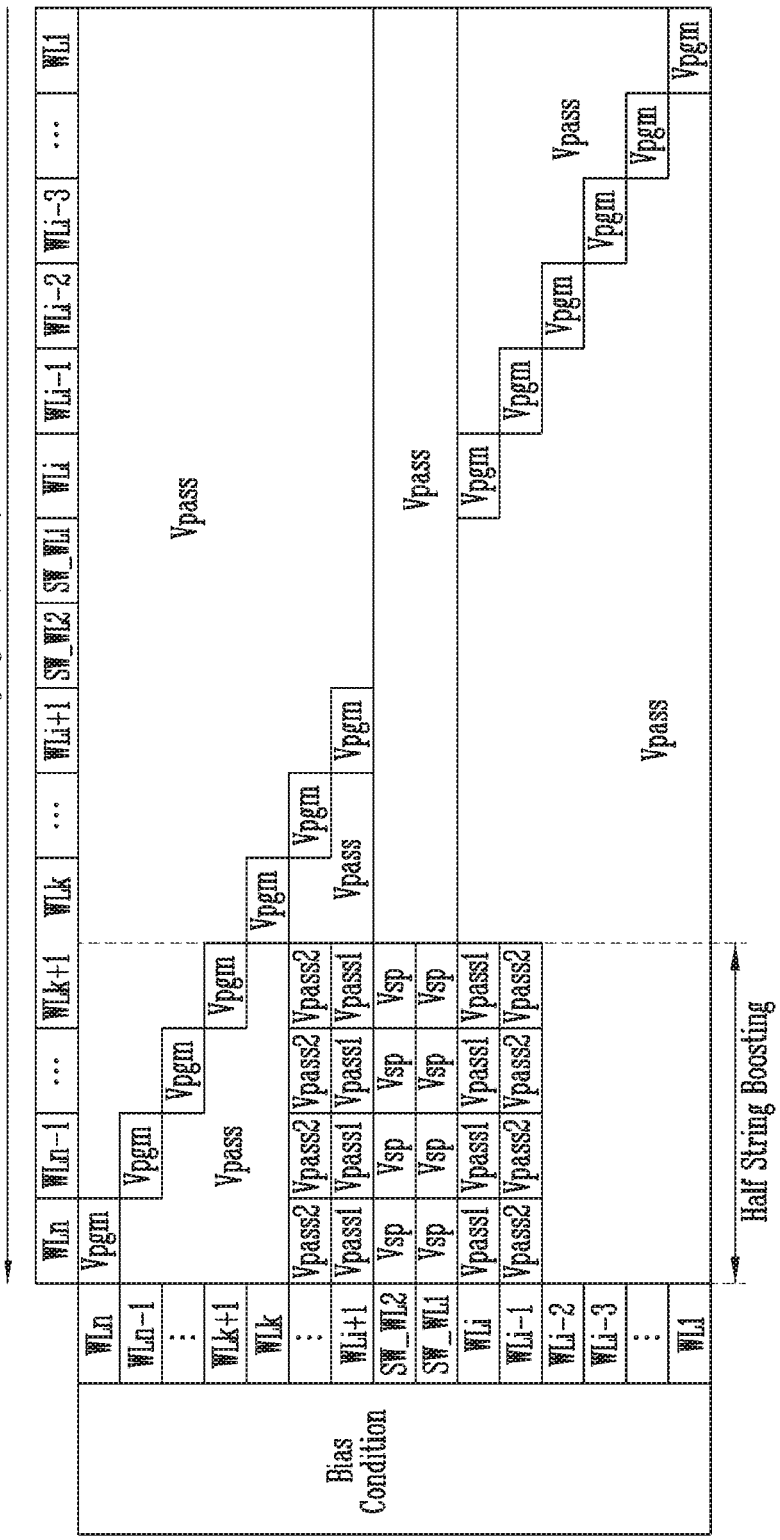

FIGS. 8A and 8B are diagrams illustrating an operating method of the semiconductor memory device in accordance with an embodiment of the present disclosure. FIG. 8A is a flowchart, and FIG. 8B is a table illustrating an operation order and conditions.

In an embodiment, the semiconductor device may include a first stack structure including first to ith word lines WL1 to WLi and a first switching word line SW_WL1 and a second stack structure including (i+1)th to nth word lines WLi+1 to WLn and a second switching word lines SW_WL2. The first stack structure may include the first channel layer 16A described with reference to FIG. 4B, and the second stack structure may include the second channel layer 16B described with reference to FIG. 4B. First to ith memory cells may be stacked along the first channel layer 16A, and (i+1)th to nth memory cells may be stacked along the second channel layer 16B. The first memory cell may include a channel layer having a narrow width as compared with the ith memory cell, and the (i+1)th memory cell may include a channel layer having a narrow width as compared to the nth memory cell. A program operation may advance from a source side S to a drain side D. Hereinafter, a case where the program operation is sequentially performed from the first word line WL1 to the nth word line WLn will be described.

Referring to FIGS. 8A and 8B, a memory cell or a page, on which a program operation is to be performed, is selected (S710). Subsequently, a program order of the selected memory cell or the selected page is compared with a first reference value (S720). When the program order is equal to or greater than the first reference value, a first disturbance compensation program operation is performed (S730). When the program order is smaller than the first reference value, a normal program operation is performed (S740). Subsequently, it is checked whether the program operation has been performed until a last page (S750). When the program operation is performed on the last page, the program operation is ended. When the program operation is not performed on the last page, a next memory cell or a next page, which is to be programmed, is selected (S710).

The first reference value may be a reference value for minimizing program disturbance of a memory cell for which a program order is relatively late. The first reference value may correspond to an order of a word line for which a program order is relatively late among the first to nth word lines WL1 to WLn. An order of a word line located at the periphery of the switching word lines SW_WL1 and SW_WL2 among the first to nth word lines WL1 to WLn may be set to the first reference value. In an embodiment, an order of a word line belonging to a range in which the program advancing rate of the first to nth word lines is 50 to 100% may set to the first reference value. In an embodiment, the first to nth word lines may be grouped into a plurality of groups, and an order of a word line programmed first in a group to which the nth word line belongs may be set to the first reference value. In an embodiment, a channel voltage slope having a gentle inclination may be formed by differentially applying a bias to word lines at the periphery of the switching word lines SW_WL1 and SW_WL2, and an order of a word line at a point at which boosting degradation caused by occurrence of Band To Band Tunneling (BTBT) is minimized which is determined by analyzing the channel voltage slope may be set to the first reference value.

Hereinafter, a case where an order of a (k+1)th word line among the (i+1)th to nth word lines WLi+1 to WLn corresponding to the second channel layer 16B corresponds to the first reference value will be described. Here, k may be an integer of 2 or more, have a value greater than i, and have a value smaller than n.

First, the normal program operation may be sequentially performed from the first word line WL1 to a kth word line WLk. A bias having a ground level is applied to a selected bit line, and a power voltage VDD is applied to an unselected bit line. A drain select transistor of a selected memory string is turned on, and a drain select transistor of a program-inhibited memory string is turned off. Source select transistors are turned off by inactivating a source line. When the first word line WL1 is selected, a program voltage Vpgm is applied to the selected first word line WL1, and a pass voltage Vpass is applied to the other unselected second to nth word lines WL2 to WLn and the switching word lines SW_WL1 and SW_WL2. Similarly, the normal program operation is performed on the second to kth word lines WL2 to WLk.

Subsequently, the first disturbance compensation program operation may be sequentially performed from the (k+1)th word line WLk+1 to the nth word line WLn. A bias having a ground level is applied to a selected bit line, and a power voltage VDD is applied to an unselected bit line. Source select transistors are turned off by inactivating a source line. When the (k+1)th word line WLk+1 is selected, a program voltage Vpgm is applied to the (k+1)th word line WLk+1, and an isolation voltage Vsp is applied to the switching word lines SW_WL1 and SW_WL2. Pass voltages Vpass, Vpass1, and Vpass2 are applied to the other unselected word lines WL1 to WLk and WLk+2 to WLn. A first pass voltage Vpass1 may be applied to ith and (i+1)th word lines WLi and WLi+1 adjacent to the switching word lines SW_WL1 and SW_WL2, a second pass voltage Vpass2 may be applied to (i−1)th and (i+2)th word lines WLi−1 and WLi+2, and a pass voltage Vpass may be applied to the other word lines WL1 to WLi−2, WLi+3 to WLk, and WLk+2 to WLn. Similarly, the first disturbance compensation program operation is performed on (k+2)th to nth word lines WLk+2 to WLn.

According to the operating method described above, switching memory cells are turned off when the first disturbance compensation program operation is performed. Therefore, a channel region of first to ith memory cells and a channel region of (i+1)th to nth memory cells are electrically isolated from each other. Thus, the channel region of the (i+1)th to nth memory cells can be sufficiently boosted by the program voltage Vpgm applied to the (k+1)th word line WLk+1. Accordingly, the program disturbance can be minimized.

In addition, the first pass voltage Vpass1 is applied to the ith and (i+1)th word lines WLi and WLi+1, and the second pass voltage Vpass2 is applied to the (i−1)th and (i+2)th word lines WLi−1 and WLi+2. Thus, the channel voltage can be controlled to gently increase at the periphery of the switching word lines SW_WL1 and SW_WL2. Accordingly, memory cells can be prevented from being degraded by the BTBT at the periphery of the switching word lines SW_WL1 and SW_WL2.

Figure 9A:
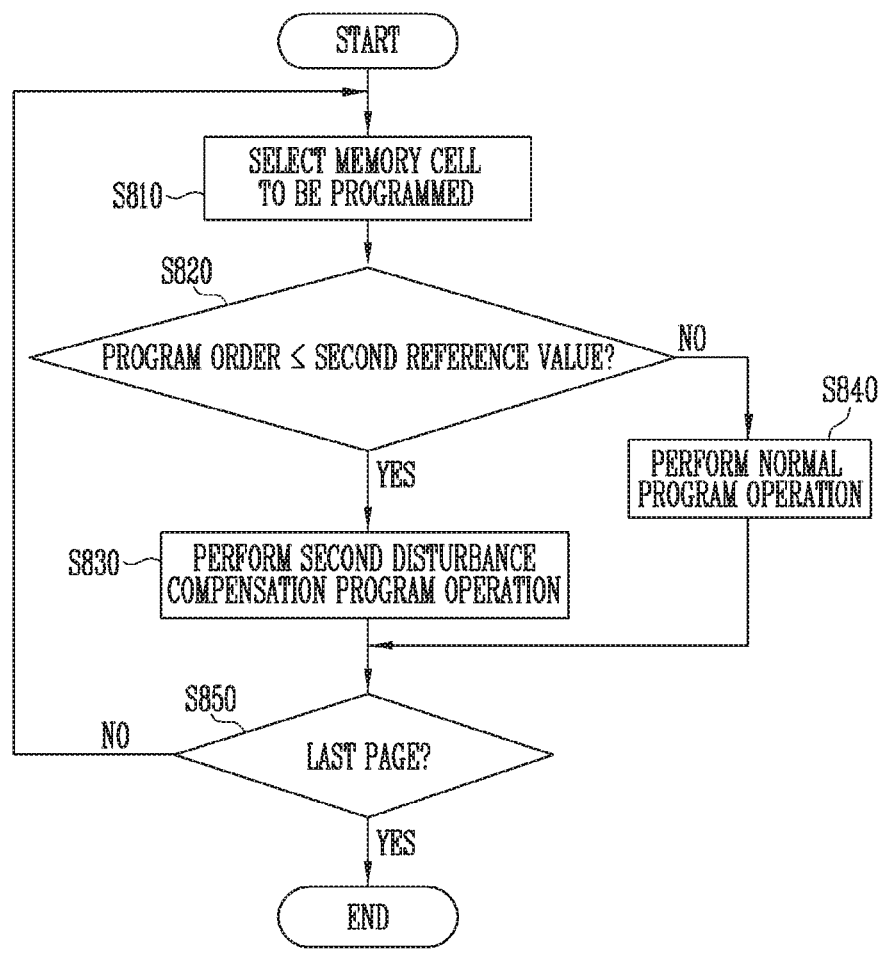
FIGS. 9A to 9C are diagrams illustrating an operating method of the semiconductor memory device in accordance with an embodiment of the present disclosure.
Figure 9B:
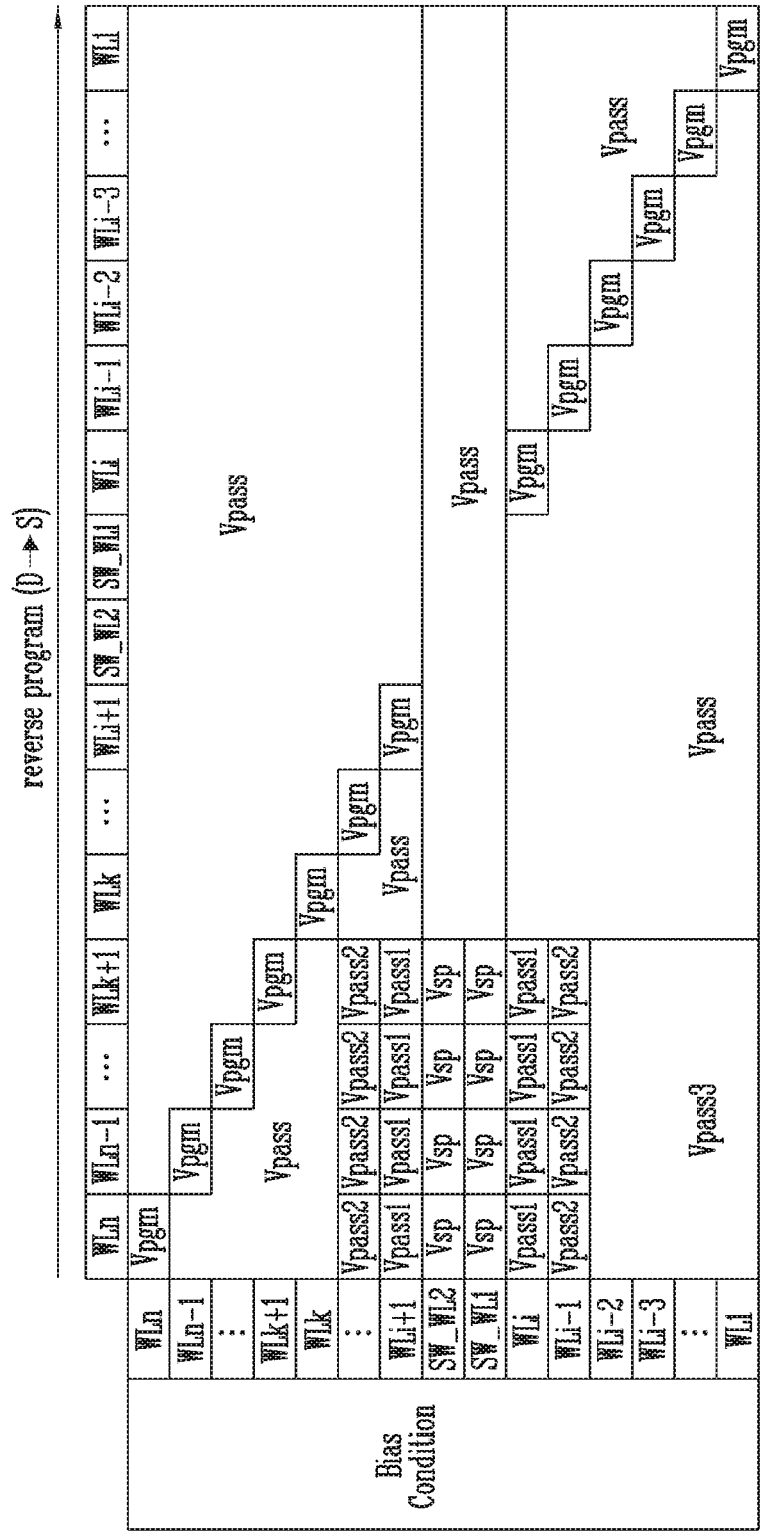
Figure 9C:
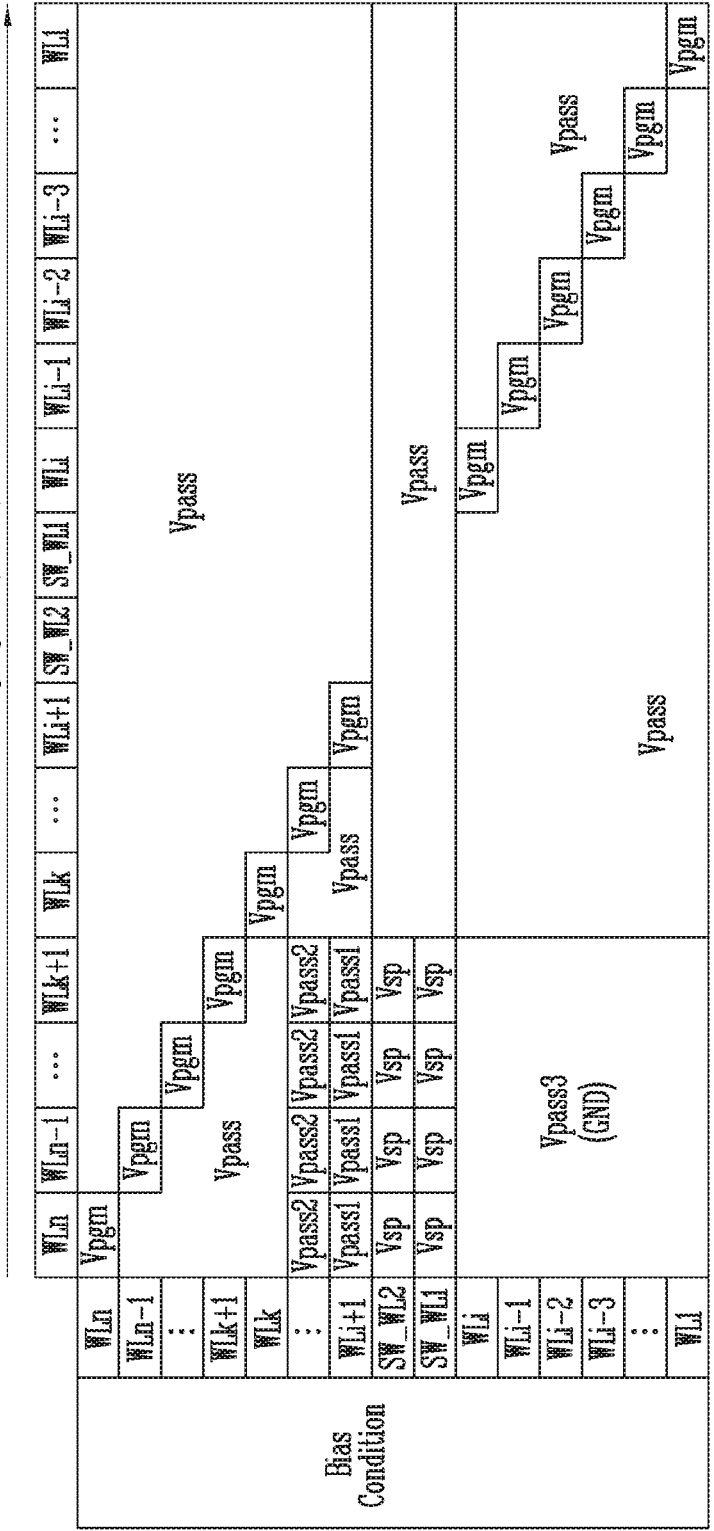

FIGS. 9A to 9C are diagrams illustrating an operating method of the semiconductor memory device in accordance with an embodiment of the present disclosure. FIG. 9A is a flowchart, and FIGS. 9B and 9C are tables illustrating operating conditions.

In an embodiment, the semiconductor device may include a first stack structure including first to ith word lines WL1 to WLi and a first switching word line SW_WL1 and a second stack structure including (i+1)th to nth word lines WLi+1 to WLn and a second switching word lines SW_WL2. The first stack structure may include the first channel layer 16A described with reference to FIG. 4B, and the second stack structure may include the second channel layer 16B described with reference to FIG. 4B. First to ith memory cells may be stacked along the first channel layer 16A, and (i+1)th to nth memory cells may be stacked along the second channel layer 163. The first memory cell may include a channel layer having a narrow width as compared with the ith memory cell, and the (i+1)th memory cell may include a channel layer having a narrow width as compared to the nth memory cell. A program operation may advance from a drain side D to a source side S. Hereinafter, a case where the program operation is sequentially performed from the nth word line WLn to the first word line WL1 will be described.

Referring to FIGS. 9A to 9C, a memory cell or a page, on which a program operation is to be performed, is selected (S810). Subsequently, a program order of the selected memory cell or the selected page is compared with a second reference value (S820). When the program order is equal to or smaller than the second reference value, a second disturbance compensation program operation is performed (S830). When the program order is greater than the second reference value, a normal program operation is performed (S840). Subsequently, it is checked whether the program operation has been performed until a last page (S850). When the program operation is not performed on the last page, a next memory cell or a next page, which is to be programmed, is selected (S810).

The second reference value may be a reference value for compensating for pass disturbance of memory cells of which channel layer has a narrow width and for which a program order is late. The second reference value may correspond to an order of a word line for which a program order is relatively early among the first to nth word lines WL1 to WLn. An order of a word line located at the periphery of the switching word lines SW_WL1 and SW_WL2 among the first to nth word lines WL1 to WLn may be set to the second reference value. In an embodiment, an order of a word line belonging to a range in which the program advancing rate of the first to nth word lines is 50 to 100% may set to the second reference value. In an embodiment, the first to nth word lines may be grouped into a plurality of groups, and an order of a word line lastly programmed in a group to which the nth word line belongs may be set to the second reference value. In an embodiment, a channel voltage slope having a gentle inclination may be formed by differentially applying a bias to word lines at the periphery of the switching word lines SW_WL1 and SW_WL2, and an order of a word line at a point at which pass disturbance is minimized which is determined by analyzing the channel voltage slope may be set to the second reference value.

Hereinafter, a case where a (k+1)th word line among nth to the (i+1)th word lines WLn to WLi+1 corresponding to the second channel layer 16B corresponds to the second reference value will be described.

First, the second disturbance compensation program operation may be sequentially performed from the nth word line WLn to the (k+1)th word line WLk+1. A bias having a ground level is applied to a selected bit line, and a power voltage VDD is applied to an unselected bit line. A drain select transistor of a selected memory string is turned on, and a drain select transistor of a program-inhibited memory string is turned off. Source select transistors are turned off by inactivating a source line.

When the nth word line WLn is selected, a program voltage Vpgm is applied to the selected nth word line WLn, and an isolation voltage Vsp is applied to the switching word lines SW_WL1 and SW_WL2. Pass voltages Vpass1, Vpass2, and Vpass3 are applied to unselected word lines WLn-1 to WL1. The pass voltages Vpass1, Vpass2, Vpass3, and Vpass having different levels may be applied according to positions of the unselected word lines WLn-1 to WL1.

Referring to FIG. 9B, a first pass voltage Vpass1 may be applied to an ith and (i+1)th word lines WLi and WLi+1 adjacent to the switching word lines SW_WL1 and SW_WL2, and a second pass voltage Vpass2 may be applied to (i-1)th and (i+2)th word lines WLi-1 and WLi+2. In addition, a third pass voltage Vpass3 may be applied to word lines for which a program order is relatively late. The third pass voltage Vpass3 may be applied to word lines WL1 to WLi-2 corresponding to the first channel layer 16A. The third pass voltage Vpass3 may have a level higher than that of the second pass voltage Vpass2, and have a level lower than that of the pass voltage Vpass (Vpass1<Vpass2<Vpass3<Vpass).

Referring to FIG. 9C, the first pass voltage Vpass1 may be applied to the (i+1)th word line adjacent to the switching word lines SW_WL1 and SW_WL2, and the second pass voltage Vpass2 may be applied to the (i+2)th word line WLi+2. In addition, the third pass voltage Vpass3 may be applied to word lines for which a program order is relatively late. The third pass voltage Vpass3 may be applied to word lines WL1 to WLi corresponding to the first channel layer 16A. The third pass voltage may have a ground level.

Similarly, the second disturbance compensation program operation is performed on (n-1)th to (k+1)th word lines WLn-1 to WLk+1.

Subsequently, the normal program operation may be sequentially performed from a kth word line WLk to the first word line WL1. When the kth word line WLk is selected, a program voltage Vpgm is applied to the selected kth word line WLk, and a pass voltage Vpass is applied to unselected nth to (k+1)th word lines WLn to WLk+1, the switching word lines SW_WL1 and SW_WL2, and unselected (k-1)th to first word lines WLk-1 to WL1. Similarly, the normal program operation is performed on the (k-1)th to first word lines WLk-1 to WL1.

According to the operating method described above, switching memory cells are turned off when the second disturbance compensation program operation is performed. Therefore, a channel region of first to ith memory cells and a channel region of (i+1)th to nth memory cells are electrically isolated from each other. In addition, the third pass voltage Vpass3 having a level lower than that of the pass voltage Vpass is applied to the first to ith word lines WL1 to WLi, so that pass disturbance of the first to ith memory cells can be minimized.

Figure 10:
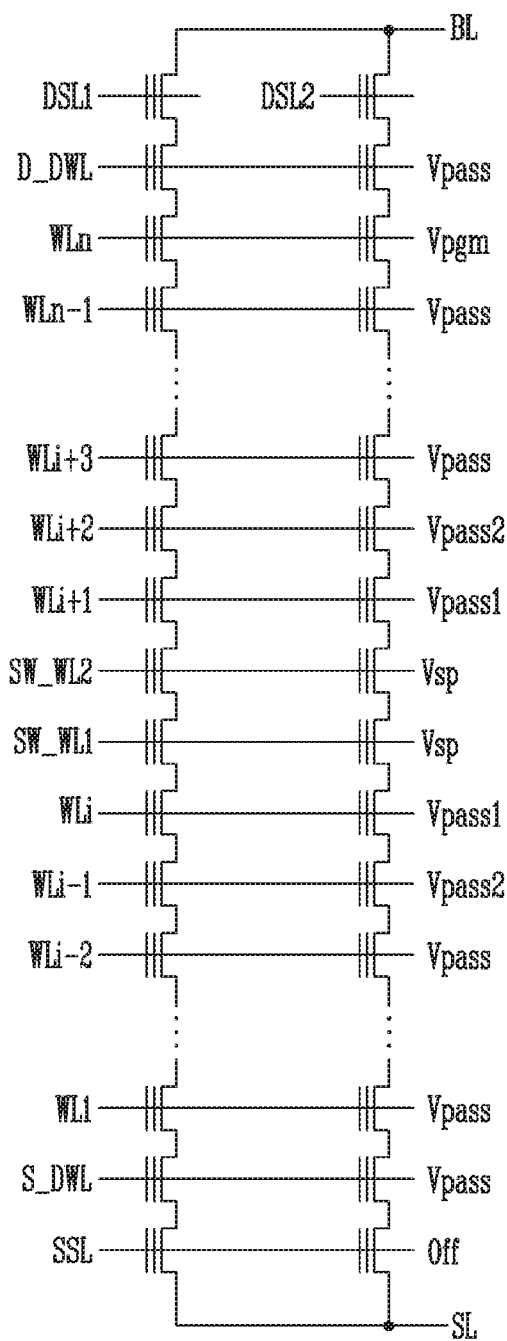
FIG. 10 is a diagram illustrating an operating method of the semiconductor memory device in accordance with an embodiment of the present disclosure.
Figure 11A:
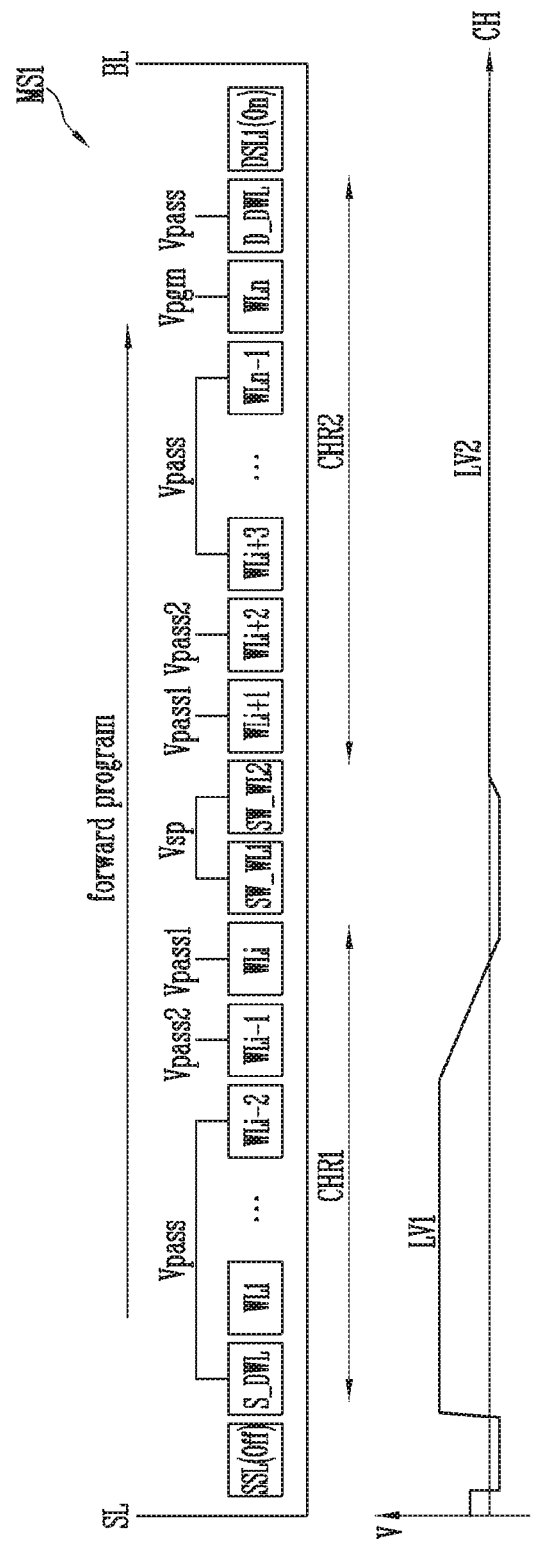
FIGS. 11A and 11B are diagrams illustrating an operating method of the semiconductor memory device in accordance with an embodiment of the present disclosure.
Figure 11B:
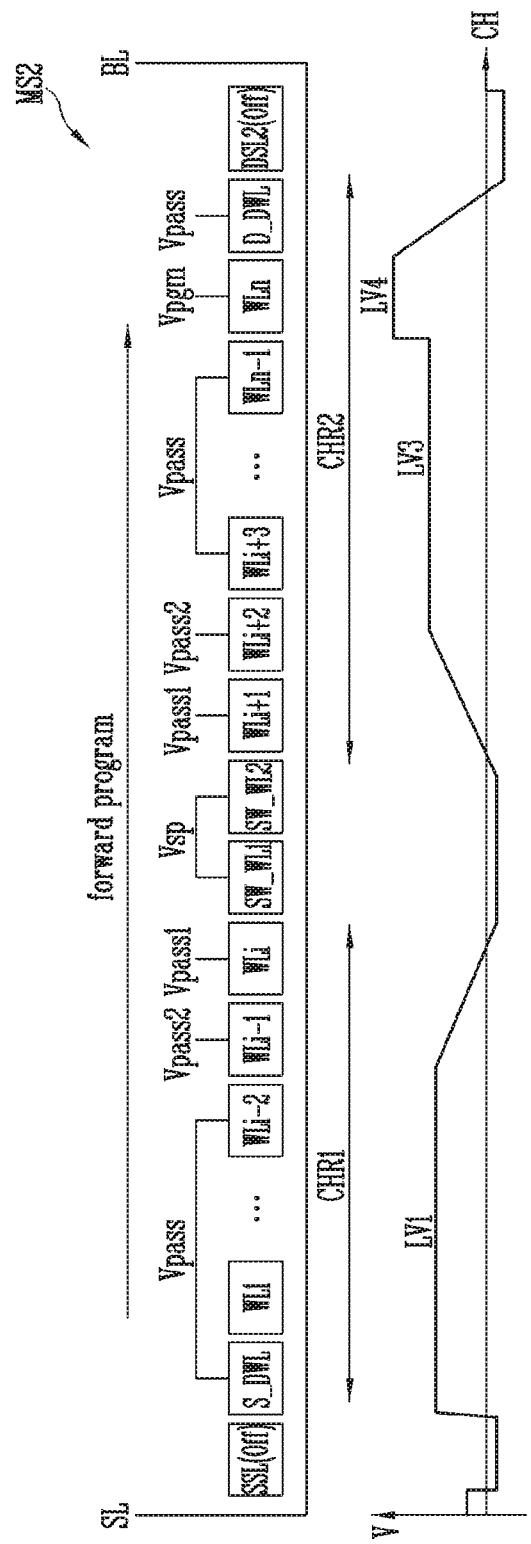

FIGS. 10, 11A, and 11B are diagrams illustrating an operating method of the semiconductor memory device in accordance with an embodiment of the present disclosure. FIG. 10 is a circuit diagram, and FIGS. 11A and 11B are diagrams a boosting level of a channel region. The X axis represents position of a channel structure CH, and the Y axis represents channel voltage. Hereinafter, descriptions of contents overlapping with those described above will be omitted.

Referring to FIG. 10, a first memory string MS1 on which a program operation is to be performed is selected. A program-inhibited second memory string MS2 shares a bit line BL. The first memory string MS1 and the second memory string MS2 shares a source select line SSL. Hereinafter, a case where a first disturbance compensation program operation is sequentially performed on first to nth word lines WL1 to WLn will be described.

FIG. 11A relates to the selected first memory string MS1, and illustrates a case where a program voltage Vpgm is applied to the nth word line WLn. An isolation voltage Vsp is applied to switching word lines SW_WL1 and SW_WL2, and switching memory cells are turned off. Accordingly, a first channel region CHR1 between the source select line SSL and a first switching word line SW_WL1 and a second channel region CHR2 between a drain select line DSL and a second switching word line SW_WL2 are electrically isolated from each other.

A source select transistor and the switching memory cells are turned off, and therefore, the first channel region CHR1 is floated. In addition, the first channel region CHR1 is boosted by pass voltages Vpass, Vpass2, and Vpass1 applied to first to ith word lines WL1 to WLi and a source-side dummy word line S_DWL. The boosted first channel region CHR1 may have a channel voltage with a first level LV1. In addition, a pass voltage (Vpass>Vpass2>Vpass1) having a lower level is applied as word lines are more adjacent to the switching word lines SW_WL1 and SW_WL2, so that a channel voltage is increased with a gentle inclination at the periphery of the switching word lines SW_WL1 and SW_WL2.

A power voltage VDD is applied to a selected first drain select line DSL1, and a drain select transistor is turned on. Therefore, the second channel region CHR2 is electrically connected to the bit line BL. A channel voltage of the second channel region CHR2 may have a second level LV2 lower than the first level LV1. The bit line BL may have a ground level, and the second level LV2 may be the ground level.

FIG. 11B relates to the program-inhibited second memory string MS2, and illustrates a case where the program voltage Vpgm is applied to the nth word line WLn. The isolation voltage Vsp is applied to the first and second switching word lines SW_WL1 and SW_WL2, and the switching memory cells are turned off. Therefore, the first channel region CHR1 and the second channel region CHR2 are electrically isolated from each other.

The source select transistor and the switching memory cells are turned off, and therefore, the first channel region CHR1 is floated. In addition, the first channel region CHR1 may be boosted to the first level LV1 by the pass voltages Vpass, Vpass2, and Vpass1 applied to the first to ith word lines WL1 to WLi and the source-side dummy word line S_DWL.

A ground voltage is applied to an unselected second drain select line DSL2, and the drain select transistor is turned off. Therefore, the second channel region CHR2 is floated. In addition, the second channel region CHR2 is boosted by the pass voltages Vpass1, Vpass2, and Vpass applied to (i+1)th to (n−1)th word lines WLi+1 to WLn−1 and the program voltage Vpgm applied to the nth word line WLn. Because the boosting caused by the program voltage Vpgm is concentrated on the second channel region CHR2, the second channel region CHR2 may be boosted to a level higher than that of the first channel region CHR1. The second channel region CHR2 may have a third level LV3 at a portion corresponding to the (i+1)th to (n−1)th word lines WLi+1 to WLn−1. In addition, the second channel region CHR2 may have a fourth level LV4 higher than the third level LV3 at a portion corresponding to the nth word line WLn to which the program voltage Vpgm having a relatively high level is applied. Thus, although a program order is late, the second channel region CHR2 of the unselected second memory string MS2 can be sufficiently boosted, and program disturbance can be minimized.

Figure 12A:
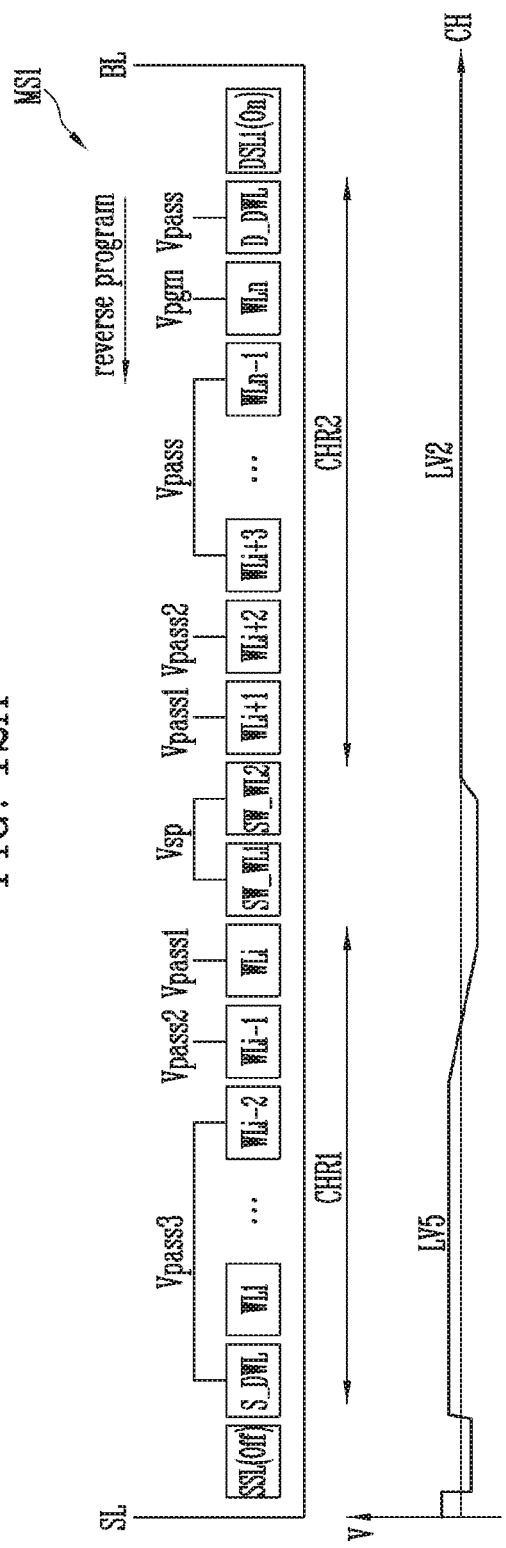
FIGS. 12A and 12B are diagrams illustrating an operating method of the semiconductor memory device in accordance with an embodiment of the present disclosure.
Figure 12B:
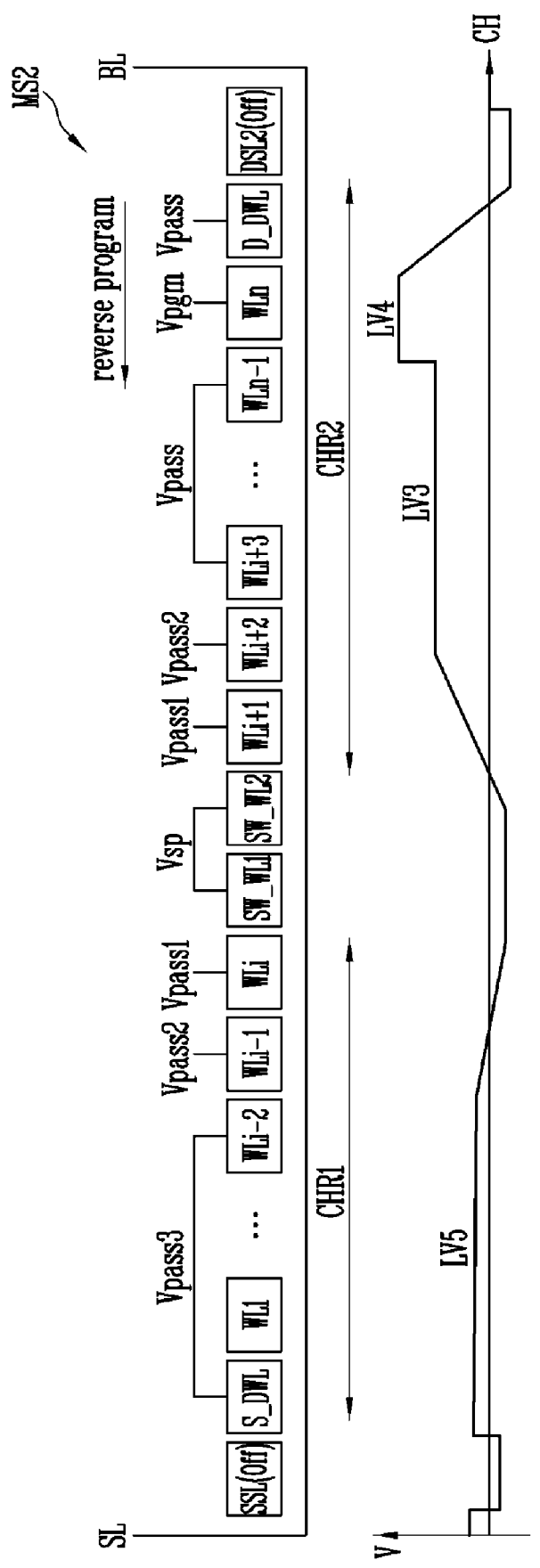

FIGS. 10, 12A, and 12B are diagrams illustrating an operating method of the semiconductor memory device in accordance with an embodiment of the present disclosure. FIG. 10 is a circuit diagram, and FIGS. 12A and 12B are diagrams illustrating a boosting level of a channel region. Hereinafter, descriptions of contents overlapping with those described above will be omitted.

Referring to FIG. 10, a first memory string MS1 on which a program operation is to be performed is selected. A program-inhibited second memory string MS2 shares a bit line BL. The first memory string MS1 and the second memory string MS2 shares a source select line SSL. Hereinafter, a case where a second disturbance compensation program operation is sequentially performed on nth to first word lines WLn to WL1 will be described.

FIG. 12A relates to the selected first memory string MS1, and illustrates a case where a program voltage Vpgm is applied to the nth word line WLn. An isolation voltage Vsp is applied to switching word lines SW_WL1 and SW_WL2, and switching memory cells are turned off. Thus, a first channel region CHR1 and a second channel region CHR2 are electrically isolated from each other.

A source select transistor and the switching memory cells are turned off, and therefore, the first channel region CHR1 is floated. In addition, the first channel region CHR1 is boosted by pass voltages Vpass, Vpass3, Vpass2, and Vpass1. A third pass voltage Vpass3 may have a level lower than that of the pass voltage Vpass. Therefore, the first channel region CHR1 may be boosted to a fifth level LV5 lower than a first level LV1. Accordingly, pass disturbance of first to ith memory cells can be minimized. In an embodiment, the second pass voltage Vpass2 may have a level higher than that of the first pass voltage Vpass1, and have a level lower than the third pass voltage Vpass3 (Vpass1<Vpass2<Vpass3). In an embodiment, the first to third pass voltages Vpass1 to Vpass3 may have a level lower than that of the pass voltage Vpass, and have a ground level.

The power voltage VDD is applied to a selected first drain select line DSL1, and a drain select transistor is turned on. Therefore, the second channel region CHR2 is electrically connected to the bit line BL. A channel voltage of the second channel region CHR2 may have a second level LV2 lower than the first level LV1. The bit line BL may have a ground level, and the second level LV2 may be the ground level.

FIG. 12B relates to the program-inhibited second memory string MS2, and illustrates a case where the program voltage Vpgm is applied to the nth word line WLn. The isolation voltage Vsp is applied to the first and second switching word lines SW_WL1 and SW_WL2, and the switching memory cells are turned off. Therefore, the first channel region CHR1 and the second channel region CHR2 are electrically isolated from each other.

The source select transistor and the switching memory cells are turned off, and therefore, the first channel region CHR1 is floated. In addition, the first channel region CHR1 is boosted by the pass voltages Vpass, Vpass3, Vpass2, and Vpass1. The third pass voltage Vpass3 may have a level lower than that of the pass voltage Vpass. Therefore, the first channel region CHR1 may be boosted to the fifth level LV5 lower than the first level LV1. Accordingly, pass disturbance of the first to ith memory cells can be minimized. In an embodiment, the second pass voltage Vpass2 may have a level higher than that of the first pass voltage Vpass1, and have a level lower than that of the third pass voltage Vpass3 (Vpass1<Vpass2<Vpass3). In an embodiment, the first to third pass voltages Vpass1 to Vpass3 may have a level lower than that of the pass voltage Vpass, and have a ground level.

A ground voltage is applied to an unselected second drain select line DSL2, and the drain select transistor turned off. Therefore, the second channel region CHR2 is floated. In addition, the second channel region CHR2 is boosted by the pass voltages Vpass1, Vpass2, and Vpass applied to (i+1)th to (n−1)th word lines WL+1 to WLn−1 and the program voltage Vpgm applied to the nth word line WLn. Because the boosting caused by the program voltage Vpgm is concentrated on the second channel region CHR2, the second channel region CHR2 may be boosted to a level higher than that of the first channel region CHR1. The second channel region CHR2 may have a third level LV3 at a portion corresponding to the (i+1)th to (n−1)th word lines WL+1 to WLn−1. In addition, the second channel region CHR2 may have a fourth level LV4 higher than the third level LV3 at a portion corresponding to the nth word line WLn to which the program voltage Vpgm having a relatively high level is applied. Thus, although a program order is late, the second channel region CHR2 of the unselected second memory string MS2 can be sufficiently boosted, and program disturbance can be minimized.

Figure 13:
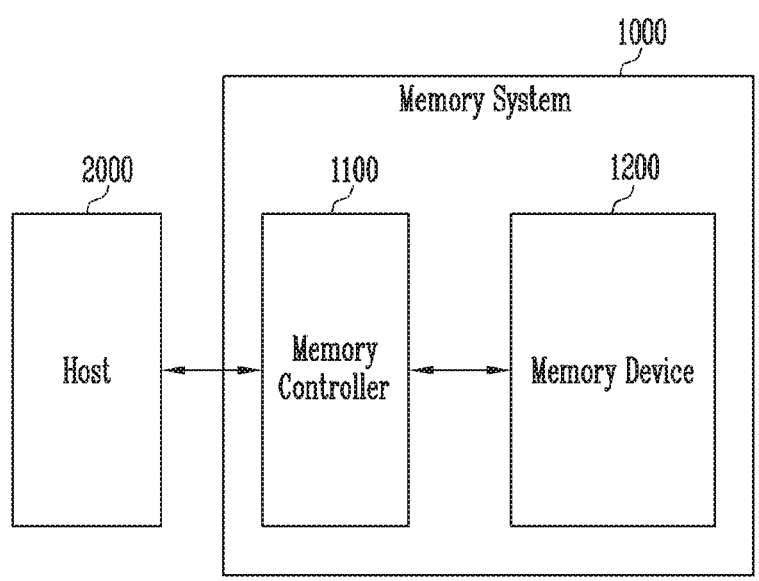
FIG. 13 is a diagram illustrating a memory system in accordance with an embodiment of the present disclosure.

FIG. 13 is a diagram illustrating a memory system 1000 in accordance with an embodiment of the present disclosure.

Referring to FIG. 13, the memory system 1000 may include a memory device 1200 configured to store data and a memory controller 1100 configured to communicate between the memory device 1200 and a host 2000.

The host 2000 may be a device or system which stores data in the memory system 1000 or retrieves data from the memory system 1000. The host 2000 may generate requests for various operations, and output the generated requests to the memory system 1000. The requests may include a program request for a program operation, a read request for a read operation, an erase request for an erase operation, and the like. The host 2000 may communicate with the memory system 1000 through various interfaces such as Peripheral Component Interconnect-Express (PCI-E), Advanced Technology Attachment (ATA), Serial ATA (SATA), Parallel ATA (PATA), Serial Attached SCSI (SAS), or Non-Volatile Memory Express (NVMe), a Universal Serial Bus (USB), a Multi-Media Card (MMC), an Enhanced Small Disk Interface (ESDI), and Integrated Drive Electronics (IDE).

The host 2000 may include at least one of a computer, a portable digital device, a tablet, a digital camera, a digital audio player, a television, a wireless communication device, and a cellular phone, but embodiments of the present disclosure are not limited thereto.

The memory controller 1100 may control overall operations of the memory system 1000. The memory controller 1100 may control the memory device 1200 according to a request RQ of the host 2000. The memory controller 1100 may control the memory device 1200 to perform a program operation, a read operation, an erase operation, and the like according to a request of the host 2000. Alternatively, the memory controller 1100 may perform a background operation, etc. for improving the performance of the memory system 1000 without any request of the host 2000.

The memory controller 1100 may transmit a control signal and a data signal to the memory device 1200 so as to control an operation of the memory device 1200. The control signal and the data signal may be transmitted to the memory device 1200 through different input/output lines. The data signal may include a command CMD, an address ADD or data DATA. The control signal may be used to distinguish a period in which the data signal is input.

The memory device 1200 may perform a program operation, a read operation, an erase operation, and the like under the control of the memory controller 1100. The memory device 1200 may be implemented with a volatile memory device in which stored data disappears when the supply of power is interrupted or a nonvolatile memory device in which stored data is retained even when the supply of power is interrupted. In an embodiment, the memory device 1200 may be the semiconductor device 100 described above, and be a flash memory device.

When a program operation is requested from the host 2000, the memory controller 1100 commands the memory device 1200 to perform the program operation by using the method described with reference to FIGS. 1 to 12B. According to this method, the reliability of programmed data can be ensured.

Figure 14:
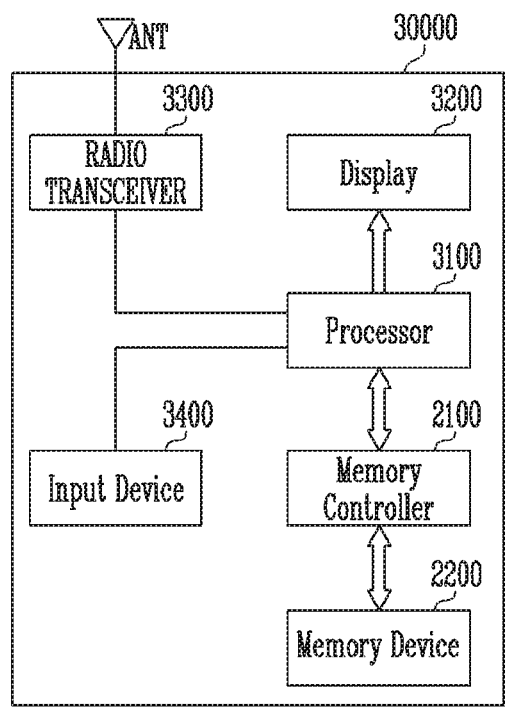
FIG. 14 is a diagram illustrating a memory system in accordance with an embodiment of the present disclosure.

FIG. 14 is a diagram illustrating a memory system 30000 in accordance with an embodiment of the present disclosure.

Referring to FIG. 14, the memory system 30000 may be implemented as a cellular phone, a smart phone, a tablet PC, a personal digital assistant (PDA), or a wireless communication device. The memory system 30000 may include a memory device 2200 and a memory controller 2100 capable of controlling an operation of the memory device 2200.

The memory controller 2100 may control a data access operation of the memory device 2200, e.g., a program operation, an erase operation, a read operation, or the like under the control of a processor 3100.

Data programmed in the memory device 2200 may be output through a display 3200 under the control of the memory controller 2100.

A radio transceiver 3300 may transmit/receive radio signals through an antenna ANT. For example, the radio transceiver 3300 may change a radio signal received through the antenna ANT into a signal that can be processed by the processor 3100. Therefore, the processor 3100 may process a signal output from the radio transceiver 3300 and transmit the processed signal to the memory controller 2100 or the display 3200. The memory controller 2100 may transmit the signal processed by the processor 3100 to the memory device 2200. Also, the radio transceiver 3300 may change a signal output from the processor 3100 into a radio signal, and output the changed radio signal to an external device through the antenna ANT. An input device 3400 is a device capable of inputting a control signal for controlling an operation of the processor 3100 or data to be processed by the processor 3100, and may be implemented as a pointing device such as a touch pad or a computer mount, a keypad, or a keyboard. The processor 3100 may control an operation of the display 3200 such that data output from the memory controller 2100, data output from the radio transceiver 3300, or data output from the input device 3400 can be output through the display 3200.

In some embodiments, the memory controller 2100 capable of controlling an operation of the memory device 2200 may be implemented as a part of the processor 3100, or be implemented as a chip separate from the processor 3100.

Figure 15:
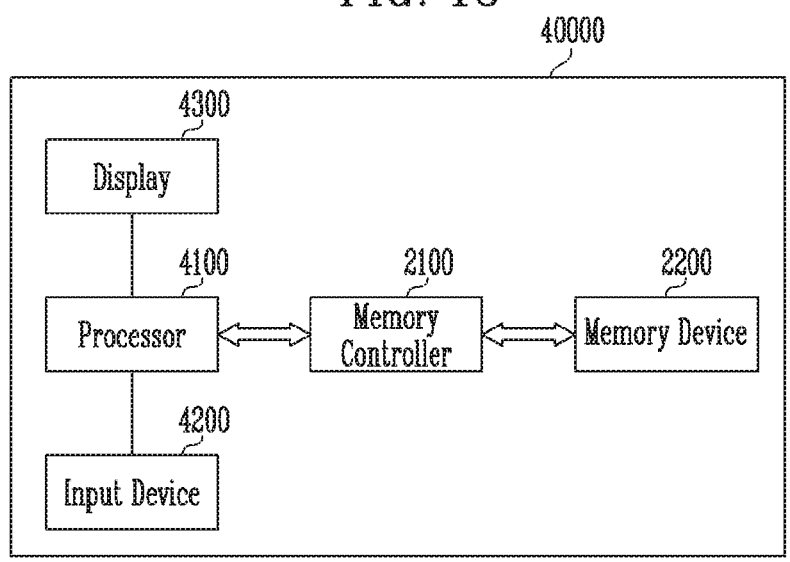
FIG. 15 is a diagram illustrating a memory system in accordance with an embodiment of the present disclosure.

FIG. 15 is a diagram illustrating a memory system 40000 in accordance with an embodiment of the present disclosure.

Referring to FIG. 15, the memory system 40000 may be implemented as a personal computer (PC), a tablet PC, a net-book, an e-reader, a personal digital assistant (PDA), a portable multi-media player (PMP), an MP3 player, or an MP4 player.

The memory system 40000 may include a memory device 2200 and a memory controller 2100 capable of controlling a data processing operation of the memory device 2200.

A processor 4100 may output data stored in the memory device 2200 through a display 4300 according to data input through an input device 4200. For example, the input device 4200 may be implemented as a pointing device such as a touch pad or a computer mouse, a keypad, or a keyboard.

The processor 4100 may control overall operations of the memory system 40000, and control an operation of the memory controller 2100. In some embodiments, the memory controller 2100 capable of controlling an operation of the memory device 2200 may be implemented as a part of the processor 4100, or be implemented as a chip separate from the processor 4100.

Figure 16:
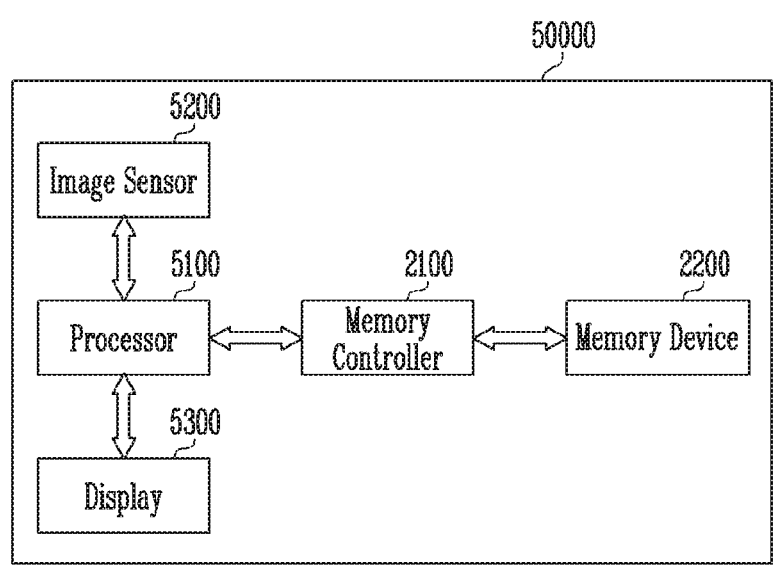
FIG. 16 is a diagram illustrating a memory system in accordance with an embodiment of the present disclosure.

FIG. 16 is a diagram illustrating a memory system 50000 in accordance with an embodiment of the present disclosure.

Referring to FIG. 16, the memory system 50000 may be implemented as an image processing device, e.g., a digital camera, a mobile terminal having a digital camera attached thereto, a smart phone having a digital camera attached thereto, or a tablet PC having a digital camera attached thereto.

The memory system 50000 may include a memory device 2200 and a memory controller 2100 capable of controlling a data processing operation of the memory device 2200, e.g., a program operation, an erase operation, or a read operation.

An image sensor 5200 of the memory system 50000 may convert an optical image into digital signals, and the converted digital signals may be transmitted to a processor 5100 or the memory controller 2100. Under the control of the processor 5100, the converted digital signals may be output through a display 5300, or be stored in the memory device 2200 through the memory controller 2100. In addition, data stored in the memory device 2200 may be output through the display 5300 under the control of the processor 5100 or the memory controller 2100.

In some embodiments, the memory controller 2100 capable of controlling an operation of the memory device 2200 may be implemented as a part of the processor 5100, or be implemented as a chip separate from the processor 5100.

Figure 17:
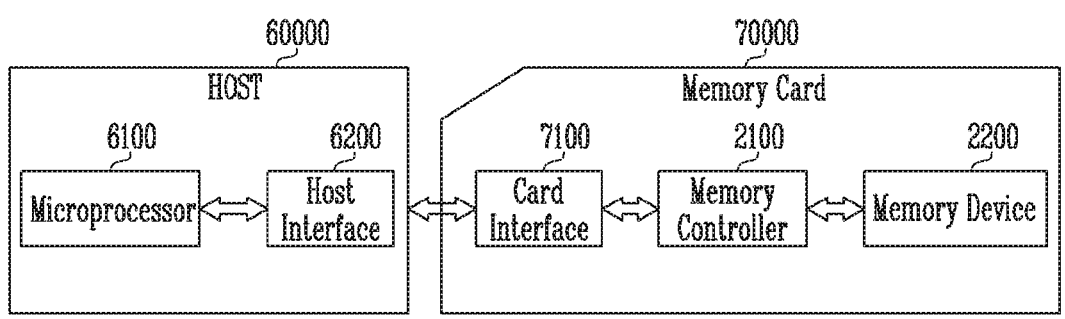
FIG. 17 is a diagram illustrating a memory system in accordance with an embodiment of the present disclosure.

FIG. 17 is a diagram illustrating a memory system 70000 in accordance with an embodiment of the present disclosure.

Referring to FIG. 17, the memory system 70000 may be implemented as a memory card or a smart card. The memory system 70000 may include a memory device 2200, a memory controller 2100, and a card interface 7100.

The memory controller 2100 may control data exchange between the memory device 2200 and the card interface 7100. In some embodiments, the card interface 7100 may be a secure digital (SD) card interface or a multi-media card (MMC) interface, but the present disclosure is not limited thereto.

The card interface 7100 may interface data exchange between a host 60000 and the memory controller 2100 according to a protocol of the host 60000. In some embodiments, the card interface 7100 may support a universal serial bus (USB) protocol and an inter-chip (IC)-USB protocol. The card interface 7100 may mean hardware capable of supporting a protocol used by the host 60000, software embedded in the hardware, or a signal transmission scheme.

When the memory system 70000 is connected to a host interface 6200 of the host 60000 such as a PC, a tablet PC, a digital camera, a digital audio player, a cellular phone, console video game hardware, or a digital set-top box, the host interface 6200 may perform data communication with the memory device 2200 through the card interface 7100 and the memory controller 2100 under the control of a microprocessor 6100.

In accordance with the present disclosure, there can be provided a semiconductor device having an improved operating characteristic and enhanced reliability, and an operating method of the semiconductor device.

While the present disclosure has been shown and described with reference to certain embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described embodiments but should be determined by not only the appended claims but also the equivalents thereof.

In the above-described embodiments, all steps may be selectively performed. For example, some of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A method for operating a semiconductor device including a memory string connected between a source line and a bit line,
    wherein the memory string includes first memory cells stacked along a first channel layer, second memory cells stacked along a second channel layer which is located above the first channel layer, and at least one switching memory cell connected between the first memory cells and the second memory cells,
    the method comprising:
    applying a program voltage to a selected word line connected to a selected second memory cell among the second memory cells;
    applying a ground voltage to a word line connected to the at least one switching memory cell while the program voltage is applied to the selected word line; and
    applying pass voltages having at least two different voltage levels to unselected word lines connected to unselected memory cells among the first memory cells and the second memory cells while the program voltage is applied to the selected word line,
    wherein applying the pass voltages includes applying a first pass voltage to a word line connected to a first adjacent memory cell adjacent to the at least one switching memory cell among the unselected memory cells and applying a second pass voltage higher than the first pass voltage to a word line connected to a second adjacent memory cell adjacent to the first adjacent memory cell among the unselected memory cells.

2. The method of claim 1, wherein the at least one switching memory cell is located in a connection region of the first channel layer and the second channel layer.

3. The method of claim 1, wherein the first channel layer is adjacent to the source line, and the second channel layer is adjacent to the bit line.

4. The method of claim 3, wherein the second memory cells are programmed after the first memory cells are programmed.

5. The method of claim 3, wherein the first memory cells are programmed after the second memory cells are programmed.

6. The method of claim 1, wherein applying the pass voltages comprises applying a third pass voltage higher than the first pass voltage and the second pass voltage to word lines connected to the other memory cells except the first and second adjacent memory cells among the unselected memory cells.

7. The method of claim 1, wherein applying the pass voltages includes:
applying a low pass voltage having a level lower than a high pass voltage of a highest level among the pass voltages to word lines connected to the first memory cells; and
applying the high pass voltage to unselected word lines connected to unselected second memory cells among the second memory cells.

8. The method of claim 7, wherein the low pass voltage has a ground level.

9. The method of claim 8, wherein the first memory cells are programmed after the second memory cells are programmed.

10. The method of claim 1, wherein, in a connection region of the first channel layer and the second channel layer, the second channel layer has a width narrower than that of the first channel layer.

11. The method of claim 1, wherein the first channel layer is adjacent to the source line, the second channel layer is adjacent to the bit line, a portion of the first channel layer, which is adjacent to the source line, has a width narrower than that of a portion of the first channel layer, which is adjacent to the second channel layer, and
wherein a portion of the second channel layer, which is adjacent to the first channel layer, has a width narrower than that of a portion of the second channel layer, which is adjacent to the bit line.

12. A method for operating a semiconductor device including a memory string connected between a source line and a bit line,
wherein the memory string includes first to nth memory cells stacked along a first channel layer and a second channel layer which is located above the first channel layer and at least one switching memory cell located in a connection region of the first channel layer and the second channel layer, wherein n is an integer of 3 or more,
the method comprising:
applying a first program voltage to a first word line connected to a kth memory cell among the first to nth memory cells, wherein k is an integer less than n;
applying a high pass voltage of a highest level among pass voltages having at least two different voltage levels to a word line connected to the at least one switching memory cell while the first program voltage is applied to the first word line connected to the kth memory cell;
applying a second program voltage to a selected word line connected to a selected (k+1)th memory cell;
applying a ground voltage to the word line connected to the at least one switching memory cell while the second program voltage is applied to the selected word line; and
applying the pass voltages to unselected word lines connected to unselected memory cells among the first to nth memory cells while the second program voltage is applied to the selected word line.

13. The method of claim 12, wherein the selected (k+1)th memory cell corresponds to the second channel layer.

14. The method of claim 12, wherein the first to kth memory cells correspond to the first channel layer or the second channel layer.

15. The method of claim 12, wherein the selected (k+1)th memory cell is programmed after the first to kth memory cells are programmed.

16. The method of claim 12, wherein the first to kth memory cells are programmed after the selected (k+1)th memory cell is programmed.

17. A semiconductor device comprising:
a memory string connected between a source line and a bit line, the memory string including first memory cells stacked along a first channel layer, second memory cells stacked along a second channel layer which is located above the first channel layer, and at least one switching memory cell connected between the first memory cells and the second memory cells;
a peripheral circuit configured to perform a program operation on the memory string; and
a control logic circuit configured to control the peripheral circuit to apply a program voltage to a selected word line connected to a selected second memory cell among the second memory cells, to apply a ground voltage to a word line connected to the at least one switching memory cell while the program voltage is applied to the selected word line, and to apply pass voltages having at least two different voltage levels to unselected word lines connected to unselected memory cells among the first memory cells and the second memory cells while the program voltage is applied to the selected word line,
wherein the control logic circuit controls the peripheral circuit to apply a first pass voltage among the pass voltages to a word line connected to a first adjacent memory cell adjacent to the at least one switching memory cell among the unselected memory cells and to apply a second pass voltage higher than the first pass voltage among the pass voltages to a word line connected to a second adjacent memory cell adjacent to the first adjacent memory cell among the unselected memory cells.

18. The semiconductor device of claim 17, wherein the control logic circuit is further configured to control the peripheral circuit to apply the program voltage to a first word line connected to a selected first memory cell among the first memory cells before applying the program voltage to a second word line connected to the selected second memory cell among the second memory cells, and to apply a high pass voltage of a highest level among the pass voltages to the word line connected to the at least one switching memory cell while the program voltage is applied to the first word line connected to the selected first memory cell.

* * * * *